United States Patent [19]

Takahashi

[11] Patent Number: 5,689,377
[45] Date of Patent: Nov. 18, 1997

[54] CATADIOPTRIC OPTICAL SYSTEM AND EXPOSURE APPARATUS HAVING THE SAME

[75] Inventor: Tomowaki Takahashi, Yokohama, Japan

[73] Assignee: Nikon Corporation, Tokyo, Japan

[21] Appl. No.: 628,165

[22] Filed: Apr. 5, 1996

[30] Foreign Application Priority Data

Apr. 7, 1995 [JP] Japan .................................. 7-082380
Feb. 19, 1996 [JP] Japan .................................. 8-030978

[51] Int. Cl.$^6$ .................................. G02B 17/00
[52] U.S. Cl. .................. 359/727; 359/732; 359/733
[58] Field of Search .................................. 359/727, 732, 359/733, 734, 735, 736, 730

[56] References Cited

U.S. PATENT DOCUMENTS

| | | | |
|---|---|---|---|
| 4,171,871 | 10/1979 | Dill et al. | 359/730 |
| 4,779,966 | 10/1988 | Friedman | 350/442 |
| 5,052,763 | 10/1991 | Singh et al. | 359/355 |
| 5,220,454 | 6/1993 | Ichihara et al. | 359/487 |
| 5,289,312 | 2/1994 | Hashimoto et al. | 359/487 |
| 5,323,263 | 6/1994 | Schoenmakers | 359/366 |
| 5,402,267 | 3/1995 | Fürter et al. | 359/727 |
| 5,559,629 | 9/1996 | Sheets et al. | 359/364 |

FOREIGN PATENT DOCUMENTS 0 604 093  6/1994  European Pat. Off. .

*Primary Examiner*—David C. Nelms
*Assistant Examiner*—John P. Cornely
*Attorney, Agent, or Firm*—Foley & Lardner

[57] ABSTRACT

A catadioptric optical system includes a first imaging optical system forming an intermediate image of a pattern provided on a first surface with a reduced magnification, including a first lens group with a positive refracting power and a second lens group which includes a concave mirror having a negative lens component. The system also includes a second image optical system forming an image of the intermediate image upon a second surface, a combined magnification of the first and second imaging optical systems being a reduction magnification. The system further includes a deflecting member disposed in an optical path from the first imaging system to the second imaging system so as to guide light from the first imaging system to the second imaging system.

32 Claims, 14 Drawing Sheets

CHROMATIC ABERRATION
OF MAGNIFICATION

CHROMATIC ABERRATION
OF MAGNIFICATION

CATADIOPTRIC OPTICAL SYSTEM AND EXPOSURE APPARATUS HAVING THE SAME

BACKGROUND OF THE INVENTION

1. Field of the Invention

The present invention relates to a projection optical system for a projection exposure apparatus such as a stepper which is used when a semiconductor device or a liquid crystal display device, for example, is manufactured in a photolithography process. In particular, the present invention relates to a catadioptric projection optical system using a reflection system as an element of its optical system.

2. Related Background Art

When a semiconductor device, a liquid crystal display device, or the like is manufactured in a lithography process, there has been used a projection exposure apparatus in which a pattern image of a reticle (or photomask, for example) is reduced by way of a projection optical system to a magnification of about ¼ to ⅕, for example, so as to be transferred onto a wafer, a glass plate, or the like (referred to as "photosensitive substrate" hereinafter) coated with a photosensitive material such as photoresist. Conventionally, as the projection exposure apparatus, that of a one-shot exposure apparatus such as a stepper has been mainly used.

Recently, in the manufacture of semiconductors and the manufacture of semiconductor chip mounting substrates, as patterns and the like formed in the semiconductors become finer, a higher resolution has been required for the exposure apparatus used for projecting their patterns onto the substrates.

In order to satisfy this requirement, the wavelength of the light source for exposure (exposure wavelength) has to be shortened or the numerical aperture NA of the projection optical system has to be increased. However, when the exposure wavelength is short, kinds of practically usable optical glass materials are limited due to absorption of illumination light, thereby making it difficult to constitute a projection optical system by a refraction system alone. In particular, when the wavelength is 300 nm or shorter, practically usable glass materials are limited to synthetic quartz and fluorite alone.

On the other hand, though there have been attempts to constitute a projection optical system by a reflection system alone, the projection system tends to have a larger size while its reflective surface has to be made aspheric in this case. However, it is quite difficult to manufacture a highly accurate aspheric surface with a large size.

Therefore, there have been proposed various techniques for constituting a projection optical system by a so-called catadioptric optical system in which a reflection system and a refraction system made of a kind of optical glass which can tolerate the exposure wavelength used are combined together.

As an example thereof, catadioptric optical systems in which an optical system including a concave mirror and a refraction optical system are combined together so as to project a reticle image with a predetermined reducing magnification are disclosed, for example, in U.S. Pat. No. 4,779,966 and Japanese Unexamined Pat. Publication Hei No. 4-234722.

The catadioptric optical system disclosed in the above-mentioned U.S. Pat. No. 4,779,966 comprises, successively from its object side, a refraction optical system and a catadioptric optical system for re-forming an image of the intermediate image derived from the refraction optical system.

Also, the optical system disclosed in Japanese Unexamined Pat. Publication Hei No. 4-34722 comprises, successively from its object side, a completely symmetric catadioptric optical system and a refraction optical system for re-forming, with a reduced magnification, an image of the intermediate image derived from the catadioptric optical system.

SUMMARY OF THE INVENTION

The inventors have studied each of the above-mentioned prior art systems and, as a result, have found the following problems.

In the catadioptric optical systems disclosed in the above-mentioned U.S. Pat. No. 4,779,966 and Japanese Unexamined Pat. Publication Hei No. 4-34722, only lens components having a negative refracting power are used as refractive optical members in the catadioptric optical system including a concave mirror. Accordingly, the diameter of the luminous flux reaching the concave mirror from the object (intermediate image) continuously increases, thereby making it impossible to reduce the diameter of the concave mirror itself.

In the catadioptric optical systems disclosed in the above-mentioned U.S. Pat. No. 4,779,966, in particular, the numerical aperture of the optical system near the image (near the substrate) has to be increased in order to increase the numerical aperture on the image side. In this case, since it is necessary for the luminous flux incident on the concave mirror in the catadioptric optical system disposed on the image side to have an increased diameter, the diameter of this concave mirror increases. Further, in the catadioptric optical systems disclosed in the above-mentioned U.S. Pat. No. 4,779,966, in conjunction with its reducing magnification, the optical path from the concave reflective mirror to the wafer cannot be made long, whereby the number of refractive lenses disposed in this optical path cannot be increased and a sufficient image-forming characteristic may not be attained. Also, for this reason, the distance between the wafer and the end surface of the optical device nearest to the wafer, namely, the working distance on the wafer side (image side) cannot be made long.

On the other hand, in the catadioptric optical system disclosed in Japanese Unexamined Patent Publication Hei No. 4-34722, an optical system using a single path for both incoming and outgoing paths constitutes a completely symmetric optical system. This configuration minimizes the aberration occurring in the optical system so as to reduce the burden of correcting aberration on the subsequent catadioptric optical system. Since it constitutes a symmetric optical system, however, the working distance near the object (near the mask) cannot be made long.

The present invention is realized in order to overcome the foregoing problems. Accordingly, the object of the present invention is to provide a catadioptric optical system which is configured such that, without deteriorating performances of its optical system, the diameter of its concave mirror can be reduced. Further, the catadioptric optical system of the present invention secures a sufficient working distance and realizes a large numerical aperture while reducing the diameter of the concave mirror. The catadioptric optical system in accordance with the present invention is applicable to both one-shot exposure type and scanning type exposure apparatuses.

In order to attain the above-mentioned object, as shown in FIGS. 1 and 2, the exposure apparatus in accordance with the present invention comprises, at least, a first stage 3

(wafer stage) which can support a photosensitive substrate (wafer W) on its main surface, a second stage 2 (reticle stage) which supports a mask (reticle R) having a predetermined pattern, a first optical system 1 for irradiating the mask with exposure light having a predetermined wavelength so as to transfer an image of the predetermined pattern formed at a first surface P1 (object plane) on the mask to a second surface P2 (image plane) on the substrate, and a catadioptric optical system 5 in accordance with the present invention which is disposed between the first stage 3 and the second stage 2 so as to project the pattern on the mask onto the substrate. The above-mentioned photosensitive substrate W is constituted by an exposure object 8 such as a silicon wafer or glass plate and a photosensitive material 7 such as a photoresist coated on the surface of the exposure object 8.

For example, as shown in FIG. 3, the above-mentioned catadioptric optical system comprises a first imaging optical system $G_1$ which forms an intermediate image of the pattern on the mask (first surface), a second imaging optical system $G_2$ which forms an image of this intermediate image upon the substrate (second surface), and a first optical path deflecting member $M_2$ which is disposed in an optical path from the first imaging optical system $G_1$ to the second imaging optical system $G_2$ and guides the light from the first imaging optical system $G_1$ to the second imaging optical system $G_2$. Here, the first optical path deflecting member $M_2$ is disposed in an optical path between the first surface P1 and a first lens group $G_{11}$ so as to be placed at a position deviated from the optical axis of the first lens group $G_{11}$.

Here, the above-mentioned first imaging optical system $G_1$ includes the first lens group $G_{11}$ having a positive refracting power and a second lens group $G_{12}$ having a concave mirror $M_1$ and a negative lens component.

In particular, the first lens group $G_{11}$ of the above-mentioned first imaging optical system $G_1$ is disposed, while a part thereof is positioned between the first optical path deflecting member $M_2$ and the second lens group $G_{12}$, in a space through which both of the light directed from the first surface P1 to the second lens group $G_{12}$ and the light directed from the second lens group $G_{12}$ to the first optical path deflecting member $M_2$ pass. Also, the first lens group $G_{11}$ includes, in the following order from the first surface P1 toward the second lens group $G_{12}$, a front lens group $G_{111}$ having a positive refracting power, an intermediate lens group $G_{112}$ having a negative refracting power, and a rear lens group $G_{113}$ having a positive refracting power.

Further, the above-mentioned second imaging optical system $G_2$ comprises a third lens group $G_{23}$ having a positive refracting power and a fourth lens group $G_{24}$ having a positive refracting power. These third lens group $G_{23}$ and fourth lens group $G_{24}$ are disposed such that the light from the first imaging optical system $G_1$ successively passes through the third lens group $G_{23}$ and the fourth lens group $G_{24}$ so as to be guided to the second surface P2 (image plane).

Preferably, the catadioptric optical system in accordance with the present invention further comprises a first aperture stop 6 disposed in an optical path between the third lens group $G_{23}$ and the fourth lens group $G_{24}$.

Preferably, the above-mentioned first imaging optical system $G_1$ further comprises a fifth lens group $G_{15}$ disposed in an optical path between the first surface P1 and the first lens group $G_{11}$. This fifth lens group $G_{15}$ includes, in the following order from the first surface P1 toward the first lens group $G_{11}$, a front lens group $G_{151}$ having a positive refracting power and a rear lens group $G_{152}$ having a negative refracting power.

In the catadioptric optical system in accordance with the present invention, the composite magnification of the first imaging optical system $G_1$ and second imaging optical system $G_2$ is set to a reduction magnification. Also, any of the first and second imaging optical systems $G_1$ and $G_2$ may have a reduction magnification. Assuming that the pattern on the first surface P1 has a height Y0 and the intermediate image formed by the first imaging optical system $G_1$ has an image height Y1, this catadioptric optical system satisfies the following condition:

$$0.4 < |Y0/Y1| < 1.2$$

Among the lens components in the catadioptric optical system in accordance with the present invention, each of lens components constituting the second imaging optical system $G_2$ comprises one of at least two kinds of optical materials having dispersion values different from each other. In particular, the third lens group $G_{23}$ in the second imaging optical system $G_2$ includes at least a negative lens component made of a high dispersion glass and a positive lens component made of a low dispersion glass, while the fourth lens group $G_{24}$ in the second imaging optical system $G_2$ includes at least a positive lens component made of a low dispersion glass.

The catadioptric optical system in accordance with the present invention is preferably disposed such that a second optical path deflecting member $M_0$ for deflecting the light from the first surface P1 is disposed in an optical path between the first surface P1 and the first lens group $G_{11}$ so as to place the first surface P1 and the second surface P2 in parallel to each other (cf. FIG. 6). In this case, the first surface P1 and the second surface P2 are preferably disposed such that a normal of the first surface P1 and a normal of the second surface P2 are orthogonal to the direction of gravity (cf. arrow indicating the direction of gravity in FIG. 6). This configuration prevents the mask (reticle R) itself from warping in the direction of gravity.

Further, in order to position the first surface P1 and the second surface P2 in parallel to each other, as shown in FIG. 9, a third optical path deflecting member $M_3$ for deflecting the light from the third lens group $G_{23}$ may be disposed in an optical path between the third lens group $G_{23}$ and the fourth lens group $G_{24}$. In this case, as shown in FIG. 9, the first surface P1 and the second surface P2 are disposed horizontally with respect to the direction of gravity, while the first surface P1 is disposed above the second surface P2.

In a preferably applied example of the catadioptric optical system in accordance with the present invention, the catadioptric optical system further comprises a field stop S which is used for changing the size of the image-forming field on the second surface P2 and disposed on a surface where the intermediate image is formed in an optical path between the first imaging optical system $G_1$ and the second imaging optical system $G_2$ (FIG. 23).

Also, the above-mentioned catadioptric optical system preferably includes a special filter, such as that shown in FIGS. 20 to 22, which is used for increasing the depth of focus and disposed at a position near the concave mirror $M_1$ in the first imaging optical system $G_1$ (e.g., in an optical path between the rear lens group $G_{113}$ in the first lens group $G_{11}$ and the second lens group $G_{12}$) or a position in an optical path of the second imaging optical system $G_2$. More preferably, in combination with the above-mentioned special filter, a second aperture stop 6 (the above-mentioned first aperture stop) is provided at a position in an optical path of the second imaging optical system $G_2$ or a position near the concave mirror $M_1$ in the first imaging optical system $G_1$ (e.g., in an optical path between the rear lens group $G_{113}$ in the first lens group $G_{11}$ and the second lens group $G_{12}$). When the above-mentioned special filter and the aperture stop are disposed in combination with each other in the catadioptric optical system, the numerical aperture of the latter can be changed.

In the present invention configured as mentioned above, the first lens group $G_{11}$ disposed in the optical path between the first surface P1 and the concave mirror $M_1$ has a positive refracting power. Accordingly, the luminous flux from the first surface P1 is converged such that the luminous flux incident on the second lens group $G_{12}$ is narrowed. Further, the diameter of the concave mirror $M_1$ in the second lens group $G_{12}$ can be reduced. Also, since the first lens group $G_{11}$ is constituted by the front lens group $G_{111}$ having a positive refracting power, the intermediate lens group $G_{112}$ having a negative refracting power, and the rear lens group $G_{113}$ having a positive refracting power, various kinds of aberrations can be favorably corrected. Further, according to this configuration, the length of the first imaging optical system $G_1$ can be reduced.

Also, in the present invention, according to the above-mentioned configuration, the working distance near the first surface P1 can be increased. Accordingly, an optical path deflecting member (e.g., first optical path deflecting member $M_2$) can be easily inserted therein. Preferably, the optical path deflecting member has only a function of simply bending the optical path. When such an optical path deflecting member is used, it becomes advantageous, for example, in that, unlike a beam splitter, the optical path deflecting member does not necessarily have a function of separating the luminous flux, the loss in optical quantity can be suppressed to almost 0%, and that occurrence of flare can become quite scarce. With the optical path deflecting member having only a function of bending the optical path, the aberration which may result from uneven characteristics of a light-dividing surface of the beam splitter used and the aberration which may result from changes in the characteristics of the light-dividing surface due to thermal absorption do not occur.

More preferably, the optical path deflecting member is disposed near the intermediate image formed by the first imaging optical system $G_1$. According to this configuration, the influence of eccentric errors upon bending of the optical path can become very small. For example, when an angular error is generated in the optical path deflecting member, the second imaging optical system $G_2$ may become eccentric with respect to the first imaging optical system $G_1$. However, the image formed on the second surface P2 only shifts with respect to the first surface P1, thereby hardly influencing the image-forming performance.

In the present invention, since the second imaging optical system $G_2$ does not have the concave mirror $M_1$, the working distance on the image side of the second image-forming optical system $G_2$ can be sufficiently secured even under a large numerical aperture.

Also, in the present invention, the second imaging optical system $G_2$ comprises the third lens group $G_{23}$ having a positive refracting power and the fourth lens group $G_{24}$ having a positive refracting power. Further, in the present invention, the aperture stop 6 is disposed in the optical path between the third lens group $G_{23}$ and the fourth lens group $G_{24}$. When this aperture stop 6 is a variable aperture stop, the coherence factor ($\sigma$ value) can be adjusted.

As a technique for increasing the depth of focus so as to improve the resolution, for example, a phase shift method in which the phase of a predetermined portion in the pattern of the reticle is shifted from the phase of the other portion is proposed in Japanese Patent Publication Sho No. 62-50811. The present invention is advantageous in that this phase shift method can be further improved since the coherence factor ($\sigma$ value) can be adjusted.

In the present invention, the first imaging optical system $G_1$ has a reduction magnification, while the second imaging optical system $G_2$ has a reduction magnification. As the refracting powers are thus arranged, designing conditions for the optical systems can be alleviated.

Also, in the present invention, the first imaging optical system $G_1$ has the fifth lens group $G_{15}$ disposed in an optical path between the first surface P1 and the first lens group $G_{11}$. This fifth lens group $G_{15}$ functions to favorably correct asymmetric aberrations which cannot be corrected by the first imaging optical system $G_1$ and the second imaging optical system $G_2$ alone, in particular, such as distortion and chromatic aberration of magnification. This fifth lens group $G_{15}$ has, in the following order from the first surface P1, the front lens group $G_{151}$ with a positive refracting power and the rear lens group $G_{152}$ with a negative refracting power. According to this configuration, the fifth lens group $G_{15}$ can favorably maintain its telecentric characteristic, while reducing its diameter as a whole.

In the present invention, each of lens components constituting the second imaging optical system $G_2$ comprises one of at least two kinds of optical materials having dispersion values different from each other. Accordingly, the chromatic aberration correcting effect can be improved.

Also, in the present invention, the third lens group $G_{23}$ in the second imaging optical system $G_2$ includes a negative lens component made of a high dispersion glass and a positive lens component made of a low dispersion glass, while the fourth lens group $G_{24}$ in the second imaging optical system $G_2$ includes a positive lens component made of a low dispersion glass. According to this configuration, the chromatic aberration correcting effect can be further improved.

Further, in the present invention, the following condition is satisfied:

$$0.4 < |Y0/Y1| < 1.2 \tag{1}$$

wherein Y0 is the height of an object (pattern) on the first surface P1 and Y1 is the height of the intermediate image formed by the first imaging optical system $G_1$.

Within this condition range, the optical system can be configured easily. When this ratio is below the lower limit of condition (1), the reduction magnification of the first imaging optical system $G_1$ becomes so large that it may become difficult to perform exposure in a wide range. By contrast, when this ratio exceeds the upper limit of condition (1), the reduction magnification of the first imaging optical system $G_1$ becomes so small that the diameter of the concave mirror may not be reduced. Here, better results can be obtained when the lower and upper limits of condition (1) are set to 0.6 and 1.0, respectively.

Further, the present invention preferably satisfies the following condition:

$$1/10 < |\beta| < 1/2 \tag{2}$$

wherein $\beta$ is the magnification of the catadioptric optical system as a whole.

Within this condition range, as in the case of the above-mentioned condition (1), the optical system can be configured under alleviated design conditions. When the absolute value of this magnification is below the lower limit of condition (2), the reduction magnification becomes so large that it may become difficult to perform exposure in a wide range. By contrast, when the absolute value of this magnification exceeds the upper limit of condition (2), the reduction magnification of the catadioptric optical system as a whole becomes so small that it may not be called a reduction projection exposure apparatus any more. Here, better results can be obtained when the lower limit of condition (2) is set to ⅛.

Also, the present invention preferably satisfies the following condition:

$$P_{12} < 0 \quad (3)$$

wherein $P_{12}$ is Petzval's sum of the second lens group $G_{12}$. If condition (3) is not satisfied, the luminous flux emitted from the second lens group $G_{12}$ will become greater than that incident thereon. This situation is unfavorable since each lens component of the first lens group $G_{11}$ will have a larger size thereby. In addition, it is not preferable since Petzval's sum of the catadioptric optical system itself increases so that the image plane may not be flat any more.

Further, the present invention preferably satisfies the following condition:

$$P_{11} + P_{23} + P_{24} + P_{15} < 0 \quad (4)$$

Here, $P_{11}$, $P_{23}$, $P_{24}$, and $P_{15}$ indicate Petzval's sum of the first lens group $G_{11}$, that of the third lens group $G_{23}$, that of the fourth lens group $G_{24}$, and that of the fifth lens group $G_{15}$, respectively. When condition (4) is not satisfied, for example, the magnification of the catadioptric optical system as a whole increases so that a favorable reduction magnification may not be obtained.

Further, the present invention preferably satisfies the following condition:

$$|P_{11} + P_{23} + P_{24} + P_{15}| < 0 \quad (5)$$

The above condition relates to Petzval's sum of all the constituents of the catadioptric optical system. In particular, $P_{12}$ is Petzval's sum of the second lens group $G_{12}$. When condition (5) is not satisfied, for example, the image plane may warp, thereby deteriorating its flatness.

Also, the present invention preferably satisfies the following condition:

$$|P_1 + P_2| < 0 \quad (6)$$

wherein $P_1$ is Petzval's sum of the individual elements of the first imaging optical system $G_1$ when a light ray is transmitted therethrough, while $P_2$ is Petzval's sum of the second imaging optical system $G_2$. $P_1$ and $P_2$ can be expressed as:

$$P_1 = (2 \times P_{11}) + P_{12} + P_{15}$$

$$P_2 = P_{23} + P_{24}$$

When condition (6) is not satisfied, for example, the flatness of the image plane may be lost.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of a catadioptric optical system in accordance with the present invention will be explained with reference to FIGS. 1 to 24. This catadioptric optical system is applicable to both one-shot type and scanning type exposure apparatuses.

Figure 1:
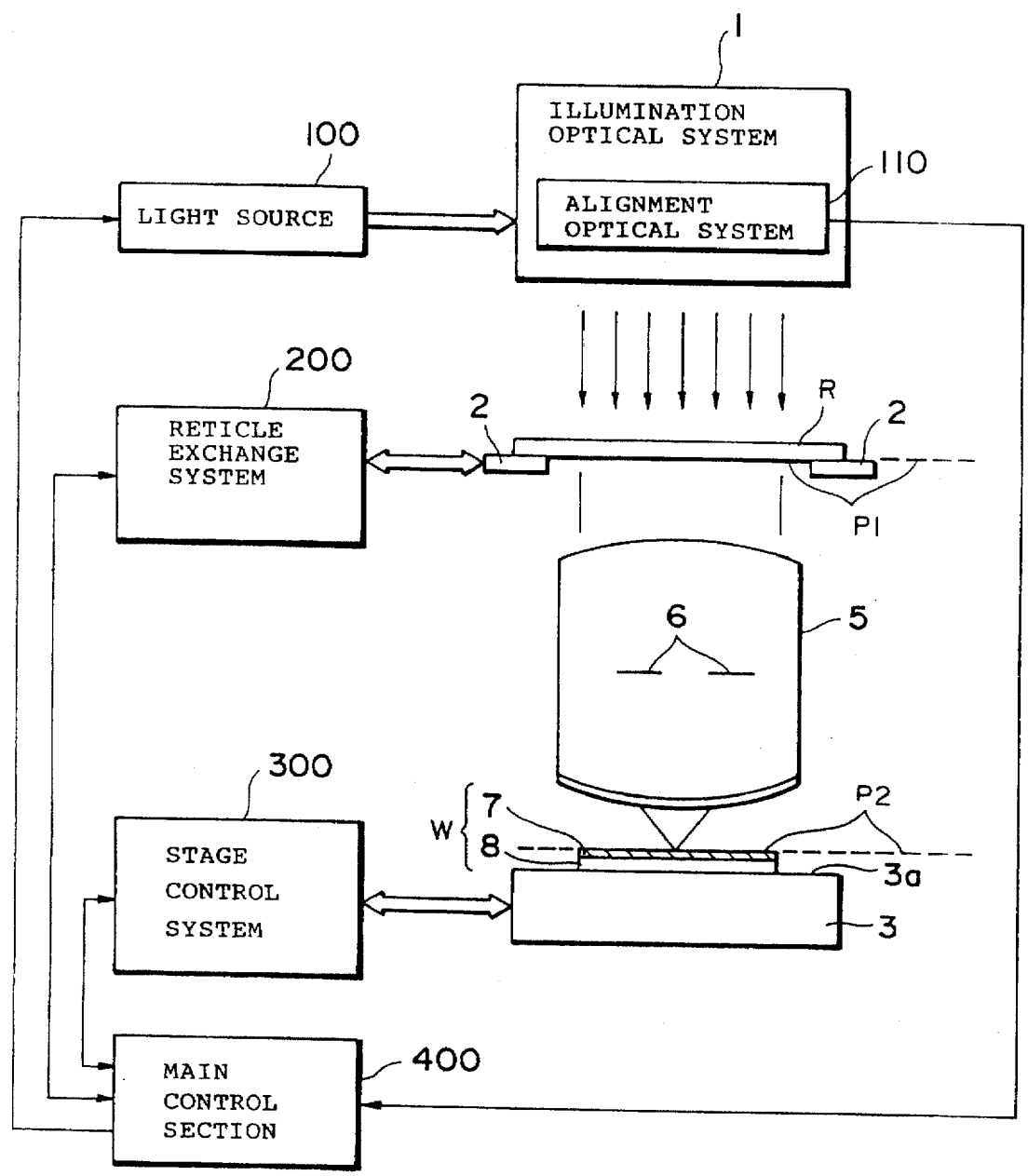
FIG. 1 is a view showing a configuration of a one-shot type exposure apparatus to which a catadioptric optical system in accordance with the present invention is applicable.

FIG. 1 is a view showing a configuration of an exposure apparatus using a one-shot exposure method. In this drawing, the exposure apparatus comprises a wafer stage 3 (first stage) which is movable and can support a photosensitive substrate W on its main surface 3a, a reticle stage 2 (second stage) which is movable and used for supporting a reticle R having a predetermined pattern, a light source 100 for emitting exposure light with a predetermined wavelength, and an illumination optical system 1 for irradiating the reticle R with the exposure light with a predetermined wavelength so as to transfer a predetermined pattern such as that of an electric circuit on the reticle R onto the substrate W. Here, the photosensitive substrate W comprises, for example, a substrate 7 such as silicon wafer or glass whose surface is coated with a photosensitive material 8 such as photoresist. Also, the illumination optical system 1 comprises an alignment optical system 110 for positioning the reticle R and the photosensitive substrate W with respect to each other.

The exposure apparatus further comprises a reticle exchange system 200 which, according to an instruction from a main control section 400, makes the reticle stage 2 exchange the reticle R held thereby for another one or moves the reticle stage 2 and a stage control system 300 which, according to an instruction from the main control section 400, moves the wafer stage 3. For example, in cases where the reticle R and the photosensitive substrate W are positioned with respect to each other, when their amounts of deviation are obtained from the alignment optical system 110, the main control section 400 computes amounts of movement of the respective stages 2 and 3 and outputs their moving instructions thereto. According to the moving instructions and amounts of movement received from the main control section 400, the stages 2 and 3 respectively move in their predetermined directions, whereby the relative positions of the reticle R and the photosensitive substrate W with respect to each other are adjusted.

A catadioptric optical system 5 in accordance with the present invention is disposed between the reticle stage 2 and the wafer stage 3, namely, between a first surface P1 (object plane) on the reticle R and a second surface P2 (image plane) on the photosensitive substrate W, so as to project, onto the second surface P2, a reduced image of the predetermined pattern on the reticle R.

Figure 2:
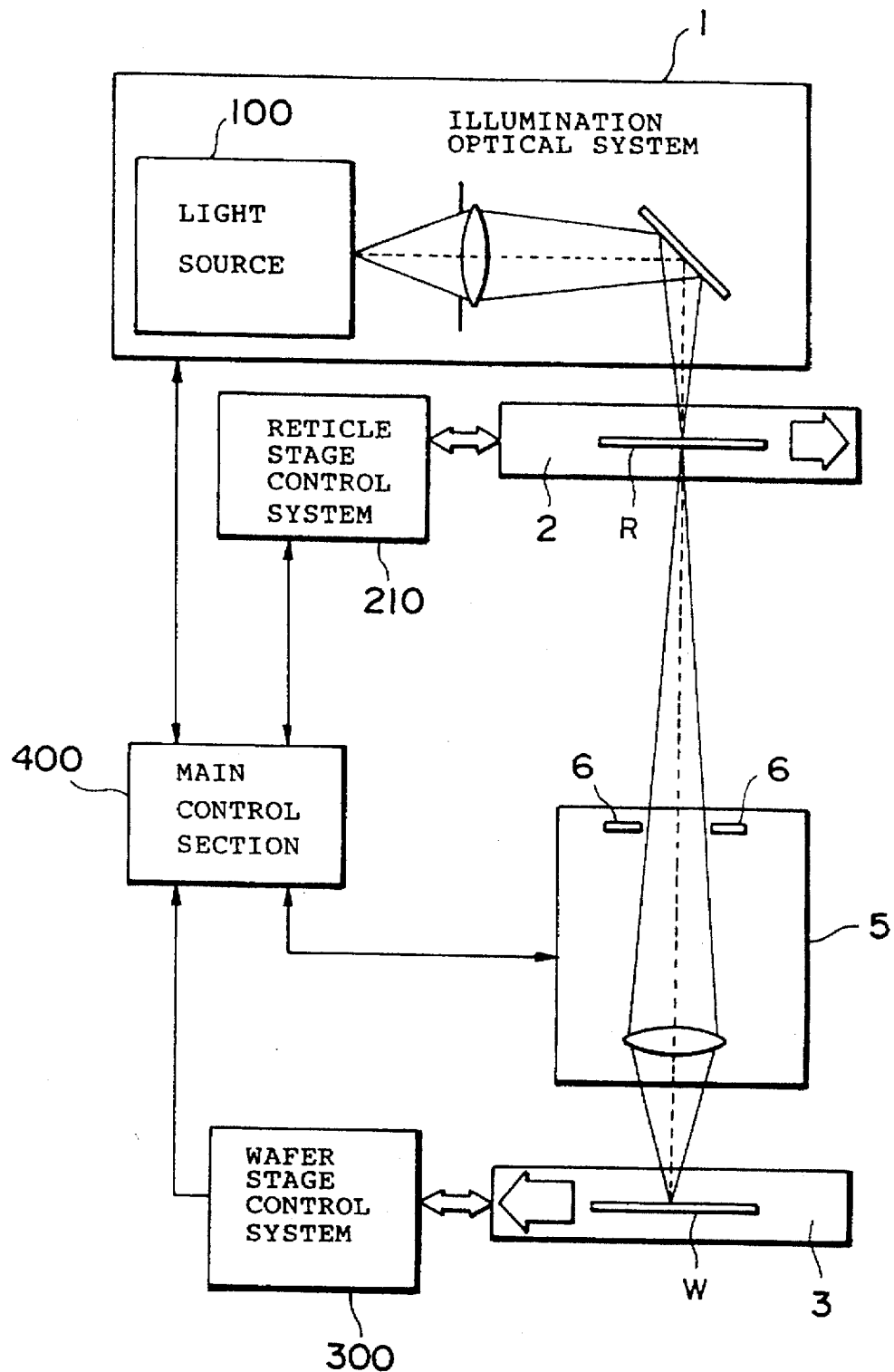
FIG. 2 is a view showing a configuration of a scanning exposure type exposure apparatus to which a catadioptric optical system in accordance with the present invention is applicable.

FIG. 2 is a view showing a scanning type exposure apparatus to which a catadioptric optical system in accordance with the present invention is applicable. In this drawing, the exposure apparatus comprises, as in the case of the one-shot exposure apparatus shown in FIG. 1, a movable reticle stage 2, a movable wafer stage 3, an illumination optical system 1 (including a light source 100), and a catadioptric optical system 5 in accordance with the present invention. The illumination optical system 1 irradiates an illumination field Rf having a predetermined form on a reticle R with exposure light from the light source 100 (cf. FIG. 4). The catadioptric optical system 5 projects, onto a substrate W (photosensitive substrate), a reduced image of a pattern in the above-mentioned field on the reticle R. A reticle stage control system 210 can move the reticle stage 2 in parallel to a second surface P2 of the substrate W and is included in the above-mentioned reticle exchange system 200. Similarly, a wafer stage control system 300 can move the wafer stage 3, thereby changing the position of the substrate W held on the stage 3. A computer system, as a main control section 400, controls the reticle stage control system 210 and the wafer stage control system 300 independently from each other. Accordingly, this exposure apparatus can perform a scanning type exposure method in which relative positions of an exposure field Wf on the substrate W and the irradiation field Rf on the reticle R with respect to each other are changed.

Technologies related to various kinds of the above-mentioned exposure apparatuses are disclosed, for example, in U.S. patent application Ser. Nos. 08/255,927, 08/260,398, and 08/299,305 as well as U.S. Pat. Nos. 4,497,015, 4,666, 273, 5,194,893, 5,253,110, 5,333,035, and 5,379,091. The catadioptric optical system in accordance with the present invention is applicable to any exposure apparatus disclosed in these references.

The above-mentioned U.S. patent application Ser. No. 08/255,927 discloses an illumination optical system (using a laser light source) which is applicable to a scanning type exposure apparatus. The above-mentioned U.S. patent application Ser. No. 08/260,398 discloses an illumination optical system (using a lamp light source) which is applicable to a scanning type exposure apparatus. U.S. patent application Ser. No. 08/299,305 discloses an alignment optical system which is applicable to a scanning type exposure apparatus. U.S. Pat. No. 4,497,015 discloses an illumination optical system (using a lamp light source) applicable to a general exposure apparatus. U.S. Pat. No. 4,666,273 discloses an example of a step and repeat type exposure apparatus. U.S. Pat. No. 5,194,893 discloses a scanning type exposure apparatus and, in particular, an illumination optical system, an illumination field, interference systems on mask and reticle sides, an automatic focus mechanism, and an alignment optical system. U.S. Pat. No. 5,253,110 discloses an illumination optical system (using a laser light source) applicable to a step and repeat type exposure apparatus. The illumination optical system disclosed in this reference, however, is also applicable to a scanning type exposure apparatus. U.S. Pat. No. 5,333,035 discloses a modified illumination optical system applicable to a general exposure apparatus. U.S. Pat. No. 5,379,091 discloses an illumination optical system (using a laser light source) applicable to a scanning type exposure apparatus.

In the following, embodiments of the catadioptric optical system in accordance with the present invention will be explained with reference to the drawings. In the embodiments explained hereinafter, the present invention is applied to a projection optical system of an exposure apparatus which, as mentioned above, transfers an image of a pattern formed on the object plane (corresponding to the surface P1) of the reticle R onto the image plane (corresponding to the surface P2) of wafer (photosensitive substrate W) coated with a resist.

Figure 3:
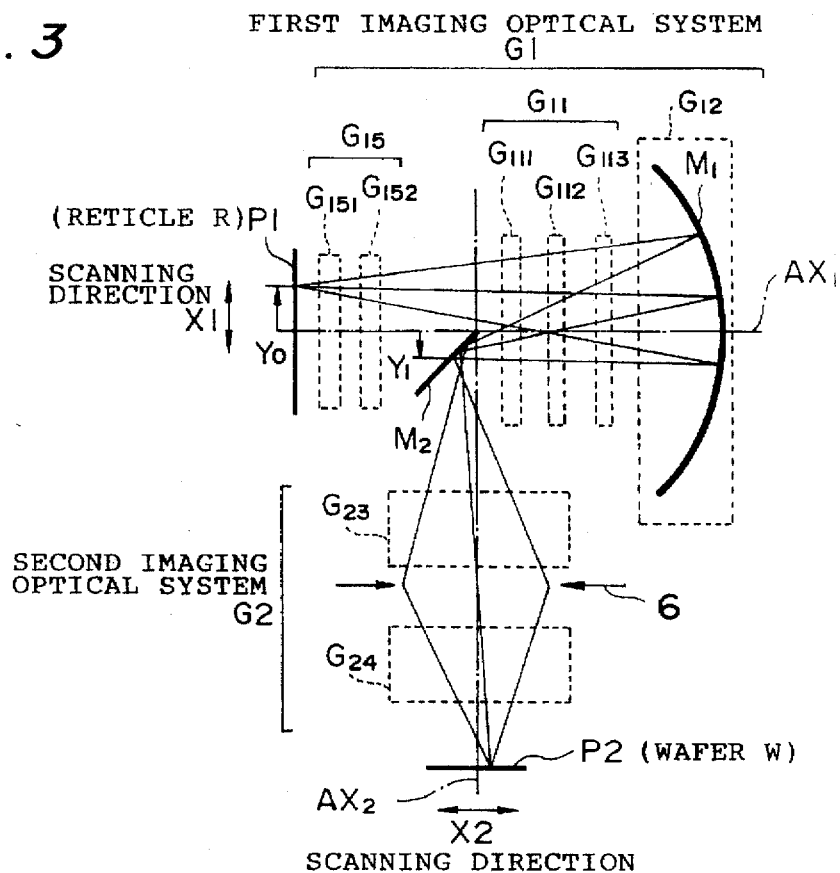
FIG. 3 is a schematic view showing a basic configuration of a catadioptric optical system in accordance with the present invention.

First, with reference to FIG. 3, a schematic configuration of the catadioptric optical system in accordance with the present invention will be explained. In FIG. 3, a luminous flux from the reticle R on the first surface P1 with a height Y0 measured from the optical axis is transmitted through a first lens group $G_{11}$ including a front lens group $G_{111}$ with a positive refractive index, an intermediate lens group $G_{112}$ with a negative refractive index, and a rear lens group $G_{113}$ with a positive refractive index so as to reach a second lens group $G_{12}$ comprising a concave mirror $M_1$ and a meniscus component whose concave surface faces the first surface P1. In a lens configuration which will be explained later (FIG. 16), the first imaging optical system $G_1$ is constituted by the above-mentioned first lens group $G_{11}$ and second lens group $G_{12}$. However, in the present embodiment, between the reticle R on the first surface P1 and the first lens group $G_{11}$, there exists a fifth lens group $G_{15}$ which is constituted by a front lens group $G_{151}$ having a positive refracting power and a rear lens group $G_{112}$ having a negative refracting power. In this drawing, $AX_1$ and $AX_2$ respectively indicate optical axes of the first imaging optical system $G_1$ and second imaging optical system $G_2$.

Here, the luminous flux which has been transmitted through the first lens group $G_{11}$ reaches the second lens group $G_{12}$. The luminous flux which has reached the second lens group $G_{12}$ is reflected by the concave mirror $M_1$ in the second lens group $G_{12}$ and then transmitted through the first lens group $G_{11}$ again so as to be guided to an optical path bending mirror $M_2$ which is used as a first optical path deflecting member. This optical path bending mirror $M_2$ is obliquely disposed by an angle of 45° with respect to the optical axes of the first and second imaging optical systems $G_1$ and $G_2$. Then, the luminous flux from the first imaging optical systems $G_1$ becomes a converging luminous flux, thereby forming, near the optical path bending mirror $M_2$, an intermediate image of the pattern (height Y0) on the reticle R with a height Y1. Subsequently, the luminous flux reflected by the optical path bending mirror $M_2$ successively passes through a third lens group $G_{23}$ and a fourth lens group $G_{24}$, which constitute the second imaging optical system $G_2$, so as to form a secondary image (image of the intermediate image) of the reticle R. Here, between the third lens group $G_{23}$ and the fourth lens group $G_{24}$, an aperture stop 6 is disposed.

Figure 4:
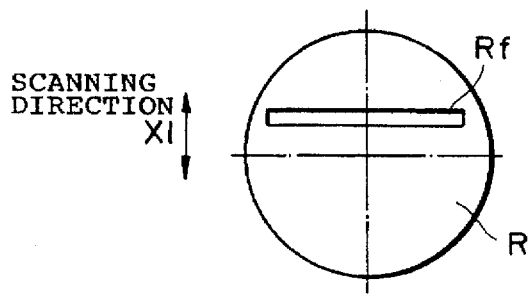
FIG. 4 is a view showing the reticle surface viewed from the illumination optical system side in the catadioptric optical system shown in FIG. 3.
Figure 5:
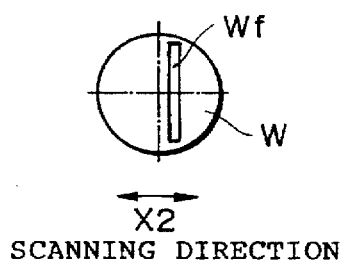
FIG. 5 is a view showing the substrate surface viewed from the second imaging optical system side in the catadioptric optical system shown in FIG. 3.

In the case of the scanning type exposure apparatus, as shown in FIG. 4, the illumination optical system 1 irradiates the illumination field Rf on the reticle R with exposure light. Accordingly, the exposure field Wf is formed on the wafer W as shown in FIG. 5. According to an instruction from the main control section 400, the reticle stage control system 210 moves the stage 2 in the direction of arrow X1 shown in FIGS. 3 and 4 so as to move the reticle R.

On the other hand, according to an instruction from the main control section 400, the wafer stage control system 300 moves the stage 3 in the direction of arrow X2 shown in FIGS. 3 and 5 so as to move the wafer W.

Figure 6:
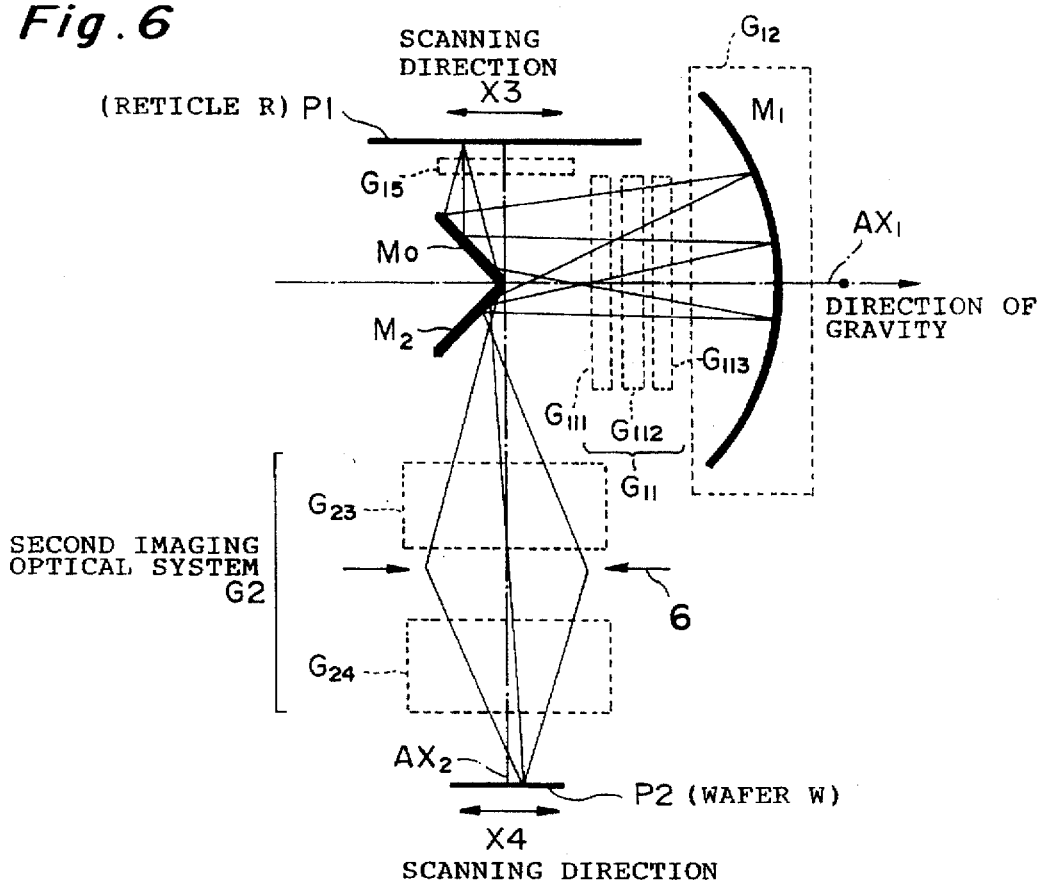
FIG. 6 is a schematic view showing a configuration of a first applied example of the catadioptric optical system in accordance with the present invention.

FIG. 6 is a schematic view showing a configuration of a first applied example of the catadioptric optical system in accordance with the present invention. In this drawing, members having similar functions to those in FIG. 3 are referred to with marks identical thereto.

The configuration of FIG. 6 differs from that of FIG. 3 in that an optical path bending mirror $M_0$, which is used as a second optical path deflecting member, is disposed in an optical path between the first surface P1 and the first lens group $G_{11}$. Here, the optical path bending mirror $M_0$ is obliquely disposed by an angle of 45° with respect to the optical axis $AX_1$ of the first lens group $G_{11}$ while being orthogonal to the optical path bending mirror $M_2$. According to this configuration, the luminous flux proceeding by way of the first imaging optical system $G_1$ and the optical path bending mirror $M_2$ attains a direction identical to the proceeding direction of the luminous flux from the first surface P1, whereby the first surface P1 and the second surface P2 can be placed in parallel to each other. Therefore, the configurations of the mechanisms for holding and scanning the first and second surfaces P1 and P2 can be simplified.

In the applied example shown in FIG. 6, the optical path bending mirrors $M_0$ and $M_2$ may be constituted by a united member. In this case, it becomes easy to process the reflective surfaces of the optical path bending mirrors $M_0$ and $M_2$ which are orthogonal to each other, thereby facilitating the maintenance of their angles. Also, in this case, the optical path bending mirrors $M_0$ and $M_2$ can have a smaller size, thereby increasing the degree of freedom in lens arrangement.

Figure 7:
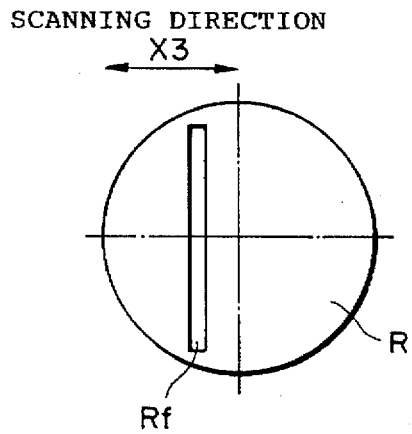
FIG. 7 is a view showing the reticle surface viewed from the illumination optical system side in the catadioptric optical system shown in FIG. 6.
Figure 8:
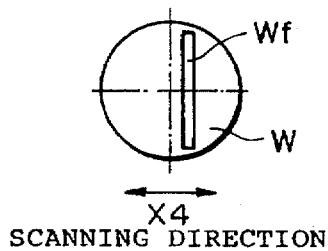
FIG. 8 is a view showing the substrate surface viewed from the second imaging optical system side in the catadioptric optical system shown in FIG. 6.

FIG. 7 is a view showing the illumination field Rf on the reticle R. This illumination field Rf is movable in the direction of arrow X3 shown in FIGS. 6 and 7 by the above-mentioned mechanisms (210, 300, and 400). On the other hand, FIG. 8 is a view showing the exposure field Wf on the wafer W. This exposure field Wf is movable in the direction of arrow X4 shown in FIGS. 6 and 8.

Figure 9:
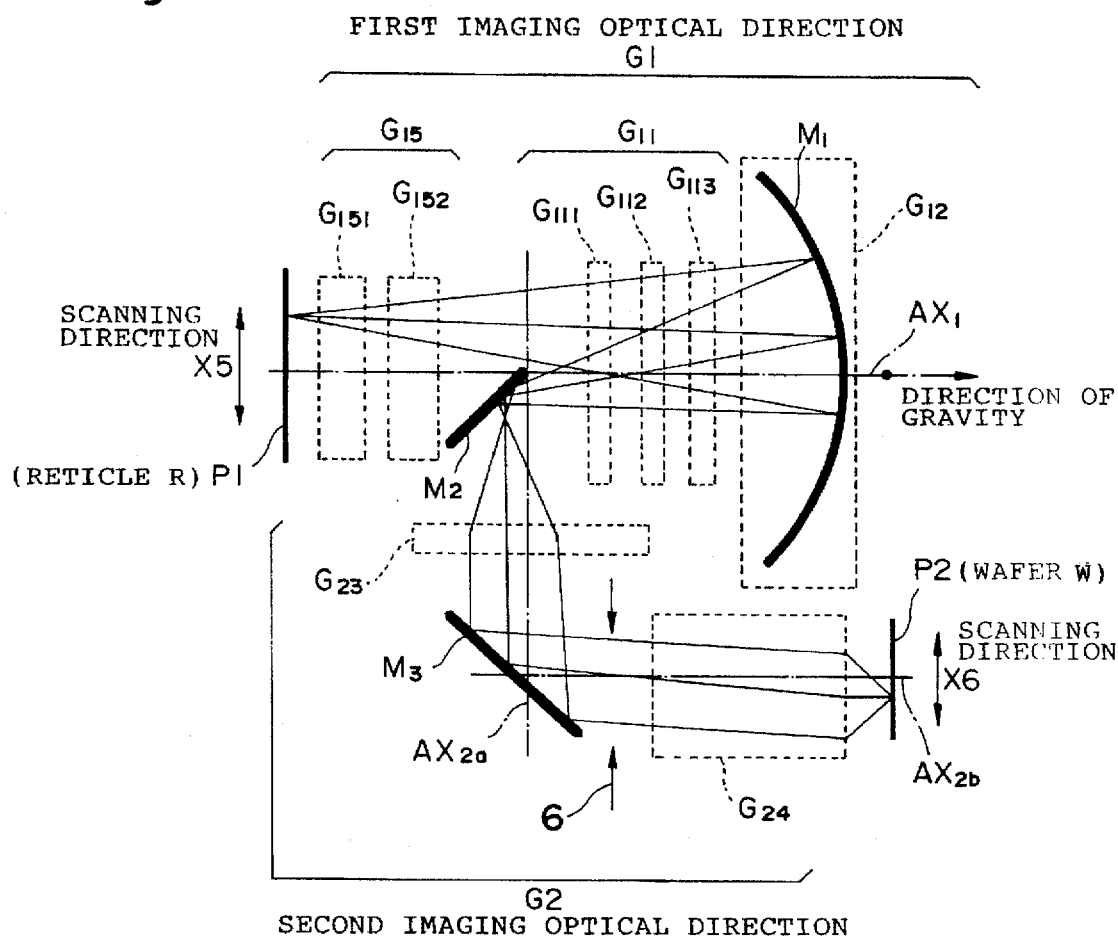
FIG. 9 is a schematic view showing a configuration of a second applied example of the catadioptric optical system in accordance with the present invention.

FIG. 9 is a schematic view showing a configuration of a second applied example of the catadioptric optical system in accordance with the present invention. In this drawing, members having similar functions to those in FIG. 3 are referred to with marks identical thereto.

The configuration of FIG. 9 differs from that of FIG. 3 in that an optical path bending mirror $M_3$, which is used as a third optical path deflecting member, is obliquely disposed, in an optical path between the third lens group $G_{23}$ and fourth lens group $G_{24}$ in the second imaging optical system $G_2$, with respect to optical axis $AX_{2a}$ of the third lens group $G_{23}$ (with respect to optical axis $AX_{2b}$ of the fourth lens group $G_{24}$) by an angle of 45°. According to this configuration, the luminous flux emitted from the fourth lens group $G_{24}$ so as to reach the second surface P2 attains a travelling direction (coinciding with the optical axis $AX_{2a}$) identical to the travelling direction (coinciding with the optical axis $AX_1$) of the luminous flux incident on the first imaging optical system $G_1$ from the first surface P1, whereby the first surface P1 and the second surface P2 can be placed in parallel to each other. Therefore, the configurations of the mechanisms for holding and scanning the first and second surfaces P1 and P2 can be simplified.

Also, in the example shown in FIG. 9, the optical path bending mirrors $M_2$ and $M_3$ are disposed such that the travelling direction of the luminous flux directed from the front lens group $G_{111}$ in the first imaging optical system $G_1$ to the optical path bending mirror $M_2$ and the travelling direction of the luminous flux directed from the optical path bending mirror $M_3$ in the second imaging optical system $G_2$ to the fourth lens group $G_{24}$ are directed opposite to each other, whereby the catadioptric optical system itself can be made compact. In particular, according to this configuration, the distance between the first surface P1 and the second surface P2 can be shortened, thereby reducing the size of the exposure apparatus as a whole. Further, since the optical path bending mirror $M_2$ is disposed near the intermediate image formed by the first imaging optical system $G_1$, the size of the optical path bending mirror $M_2$ can be reduced, thereby increasing the degree of freedom in arranging the constituents of the optical system.

Figure 10:
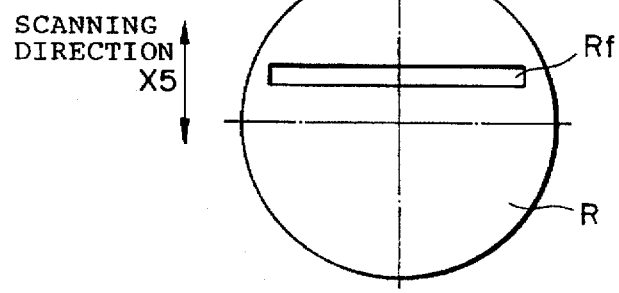
FIG. 10 is a view showing the reticle surface viewed from the illumination optical system side in the catadioptric optical system shown in FIG. 9.
Figure 11:
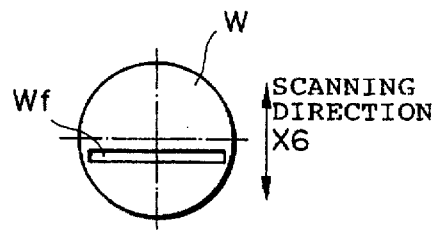
FIG. 11 is a view showing the substrate surface viewed from the second imaging optical system side in the catadioptric optical system shown in FIG. 9.

FIG. 10 is a view showing the illumination field Rf on the reticle R. This illumination field Rf is movable in the direction of arrow X5 shown in FIGS. 9 and 10 by the above-mentioned mechanisms (210, 300, and 400). On the other hand, FIG. 11 is a view showing the exposure field Wf on the wafer W. This exposure field Wf is movable in the direction of arrow X6 shown in FIGS. 9 and 11.

Further, in the embodiment shown in FIG. 6, a normal of the first surface P1 and a normal of the second surface P2 are preferably arranged perpendicular to the direction of gravity (indicated by an arrow in the drawing). This configuration is advantageous when a large photomask or glass plate is used for projection exposure, since the first surface P1, the second surface P2, and the concave mirror $M_1$, which requires the highest accuracy, are not subjected to asymmetric deformations which may occur due to the gravity.

Also, in the embodiment shown in FIG. 9, when the optical system is disposed such that the first surface P1 and the second surface P2 are placed in a direction horizontal with respect to the direction of gravity (indicated by an arrow in the drawing), the number of the optical devices which may be subjected to asymmetric deformations due to the gravity decreases. Accordingly, it is preferable that the first and second surfaces P1 and P2 be disposed horizontally, while the first surface P1 being positioned above the second surface P2. In particular, this configuration is quite advantageous in terms of optical performances since the members in the second imaging optical system $G_2$ other than the third lens group $G_{23}$ are not subjected to asymmetric deformations. Here, the feature that the concave mirror $M_1$ is horizontally arranged with respect to the gravity is particularly effective.

In each of the foregoing embodiments, the aperture stop 6 can be disposed near the concave mirror $M_1$ or in the second imaging optical system $G_2$ (between the third lens group $G_{23}$ and the fourth lens group $G_{24}$ in particular). Also in this case, the sigma ($\sigma$) value, which is the ratio of the numerical aperture NA of the illumination optical system 1 to the numerical aperture NA of the projection optical system 5, can be made variable. Most preferably, in these embodiments, the aperture stop 6 is disposed in the second imaging optical system $G_2$ which is hard to generate a mechanical interference.

Also, in place of the aperture stop 6, various kinds of special filters may be disposed in order to increase the depth of focus. This feature will be explained with reference to FIGS. 20 to 22 which show an example of a special filter.

The following numerical examples refer to an optical system in which both object and image sides are telecentric while main light rays from respective points on the object side intersect with each other at a certain point in the optical axis. Under this circumstance, a plane including the point at which the main light rays intersect with the optical axis is called Fourier transform plane. The special filter is disposed on this Fourier transform plane.

Figure 20:
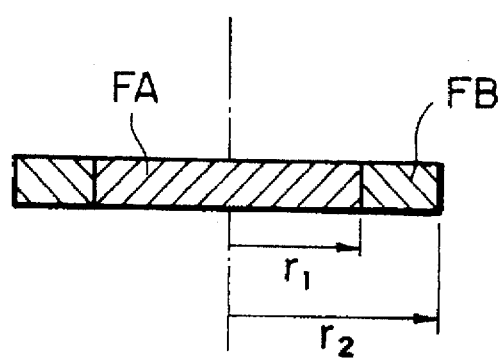
FIGS. 20 to 22 are views showing a special filter used in the catadioptric optical system in accordance with the present invention.
Figure 21:
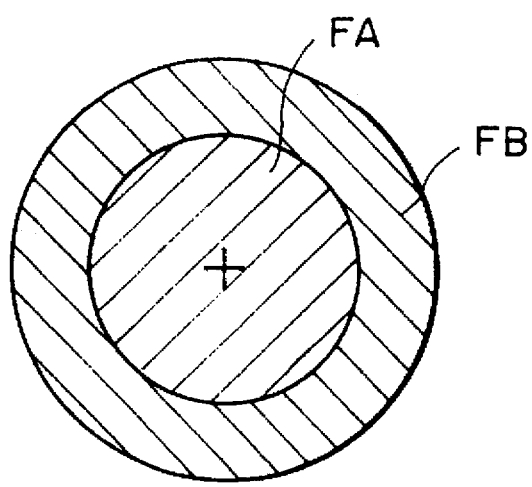

In the following numerical examples, the Fourier transform plane may be disposed near the concave mirror $M_1$ or in the second imaging optical system $G_2$. In the Fourier transform plane, the order of diffracted light is determined by a specific point remote from the optical axis. The order increases as the point is farther from the optical axis. A general projection exposure optical system utilizes zero-order and first-order diffracted light components. Accordingly, as shown in FIGS. 20 and 21, the field of the filter is divided into a field FA with a radius $r_1$ near the optical axis where the zero-order diffracted light component exists and a field FB extending from the radius $r_1$ to a radius $r_2$ near the periphery of the aperture where the first-order (or higher-order) diffracted light component exists.

Figure 22:
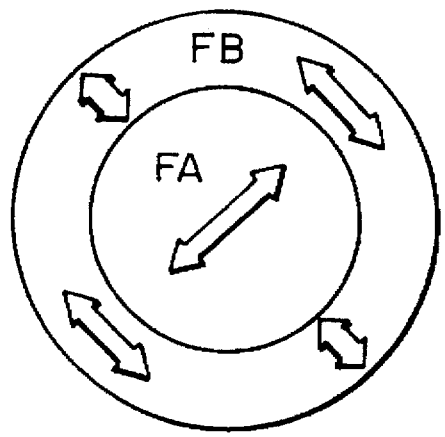

As shown in FIG. 22, the concentrically divided filter forms a polarizing film such that its center field FA transmits only S-polarized light while its peripheral field FB transmits only P-polarized light. Of course, it may be configured such that the center field FA transmits only P-polarized light while the peripheral field FB transmits only S-polarized light. Also, the refractive index of the center field FA is set lower than that of the peripheral field FB.

According to the above-mentioned configuration, the luminous flux transmitted through the peripheral field FB of the special filter effects a normal imaging at the focal plane. On the other hand, the luminous flux transmitted through the center field FA of the special filter forms, due to is lower refractive index, a focal point at a position which is farther from the lens than the normal focal plane is. Here, since the luminous flux transmitted through the peripheral field FB and the luminous flux transmitted through the center field FA have polarization conditions different from each other, they do not interfere with each other. Accordingly, the depth of focus can be increased. Techniques for increasing the depth of focus are disclosed in Japanese Unexamined Pat. Publication Sho No. 61-91662, Japanese Unexamined Patent Publication Hei No. 5-234850, Japanese Unexamined Patent Publication Hei No. 6-120110, Japanese Unexamined Patent Publication Hei No. 6-124870, Japanese Unexamined Patent Publication Hei No. 7-57992, Japanese Unexamined Patent Publication Hei No. 7-57993, and the like, each of which is applicable to the present invention. These techniques are effective, in particular, when an isolated pattern is to be formed.

When the special filter is disposed near the concave mirror $M_1$, the aperture stop 6 may be disposed in the second imaging optical system $G_2$ so as to change the numerical aperture. Alternatively, the special filter may be disposed in the second imaging optical system $G_2$, while the aperture stop 6 is disposed near the concave mirror $M_1$. Thus, in the catadioptric optical system in these embodiments, the aperture stop and the special filter can be disposed in the same optical system while being separated from each other, thereby making it advantageous in terms of spatial arrangement.

When the special filter is disposed in the second imaging optical system $G_2$, an aperture stop is preferably disposed in the illumination optical system so as to change the numerical aperture.

Also, when a stop S is disposed on a place (surface P3 shown in FIG. 23) where an intermediate image is formed, this stop may function as a field stop. In the foregoing embodiments, a field stop can be disposed between the first imaging optical system $G_1$ and the second imaging optical system $G_2$. In the foregoing embodiments, as shown in FIGS. 3, 6, and 9, the position (on the surface P3) for forming the intermediate image is close to the mirror. Accordingly, the stop is preferably disposed near the mirror. A configuration for placing a stop is exemplified by FIG. 23.

Figure 23:
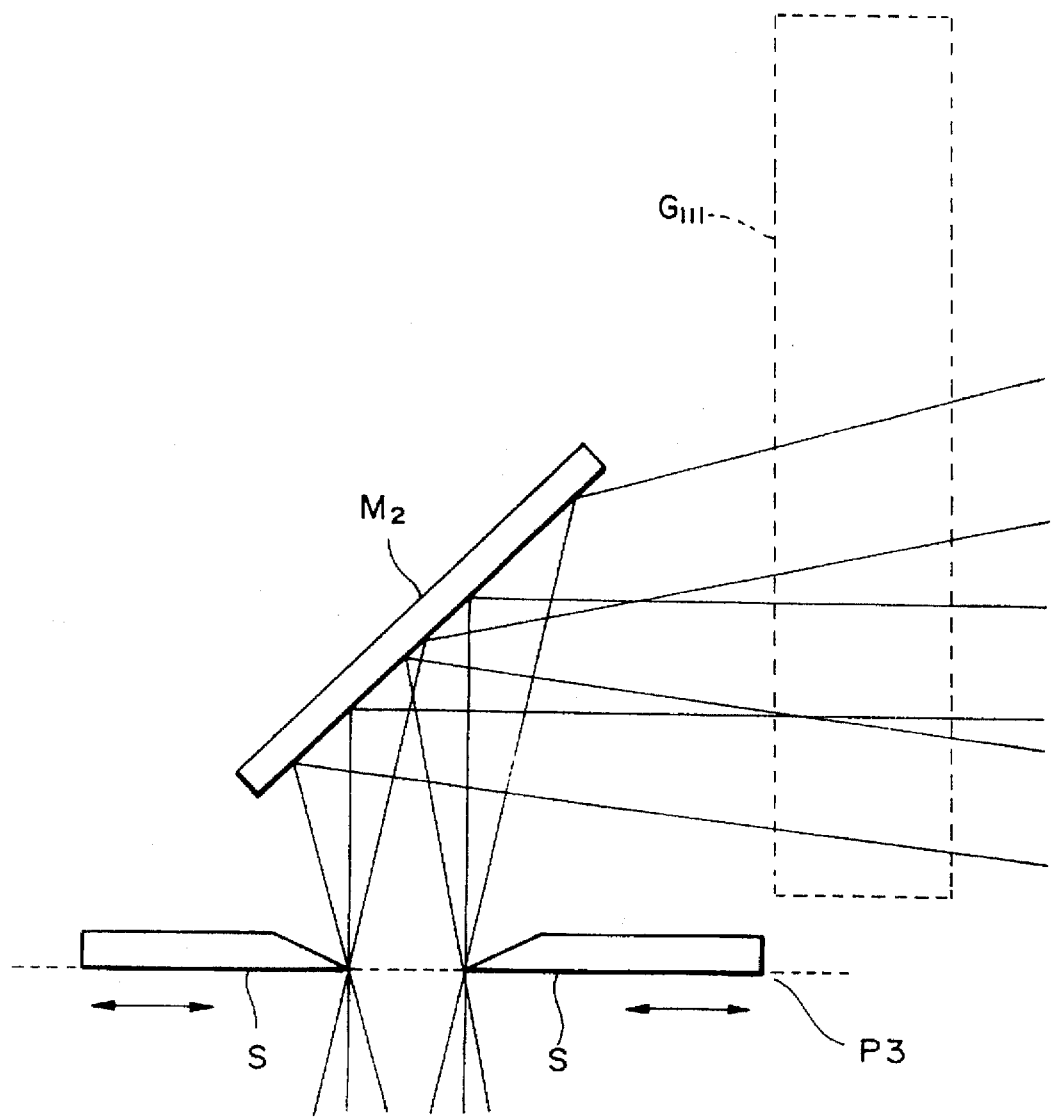
FIG. 23 is a partial view showing a configuration of a catadioptric optical system in accordance with the present invention having a field stop.

When the field stop is disposed, as in the case of the example shown in FIG. 23, the optical path bending mirror $M_1$ is placed as close as possible to the front lens group $G_{111}$ of the first imaging optical system $G_1$. Accordingly, the surface where the intermediate image is formed can be placed nearer to the third lens group $G_{23}$ in the second imaging optical system $G_2$ from the proximity of the optical path bending mirror $M_1$. According to this configuration, the optical path bending mirror $M_1$, the front lens group $G_{111}$ of the first imaging optical system $G_1$, and the field stop function are prevented from mechanically interfering with each other. Then, the field stop S composed of a light-shielding member is disposed on the surface P3 where the intermediated image is formed. A size of the area where the intermediate image can be formed changes as the field stop S moves. Accordingly, a size of the area where the image is finally formed on the second surface P2 changes.

Also, techniques for changing the size of the visual field are disclosed in Japanese Unexamined Patent Publication Sho No. 57-192024, Japanese Unexamined Patent Publication Sho No. 60-30132, Japanese Unexamined Patent Publication Sho No. 60-45252, Japanese Unexamined Utility Model Publication Sho No. 62-124845, U.S. Pat. No. 4,473, 293, U.S. Pat. No. 4,474,463, and the like, each of which is applicable to the embodiments described here.

Alternatively, without moving the movable light-shielding member in response to the circumstances as mentioned above, mirrors with different sizes themselves may be exchanged for each other so as to be used in place of a field stop.

Of course, the form of the field stop having a variable aperture shown in FIG. 23 may be not only square but also of an arc or a polygon higher than the square. Also, since the field stop can be disposed in the projection optical system, so-called reticle blind disposed in the illumination optical system can of course be eliminated.

Figure 12:
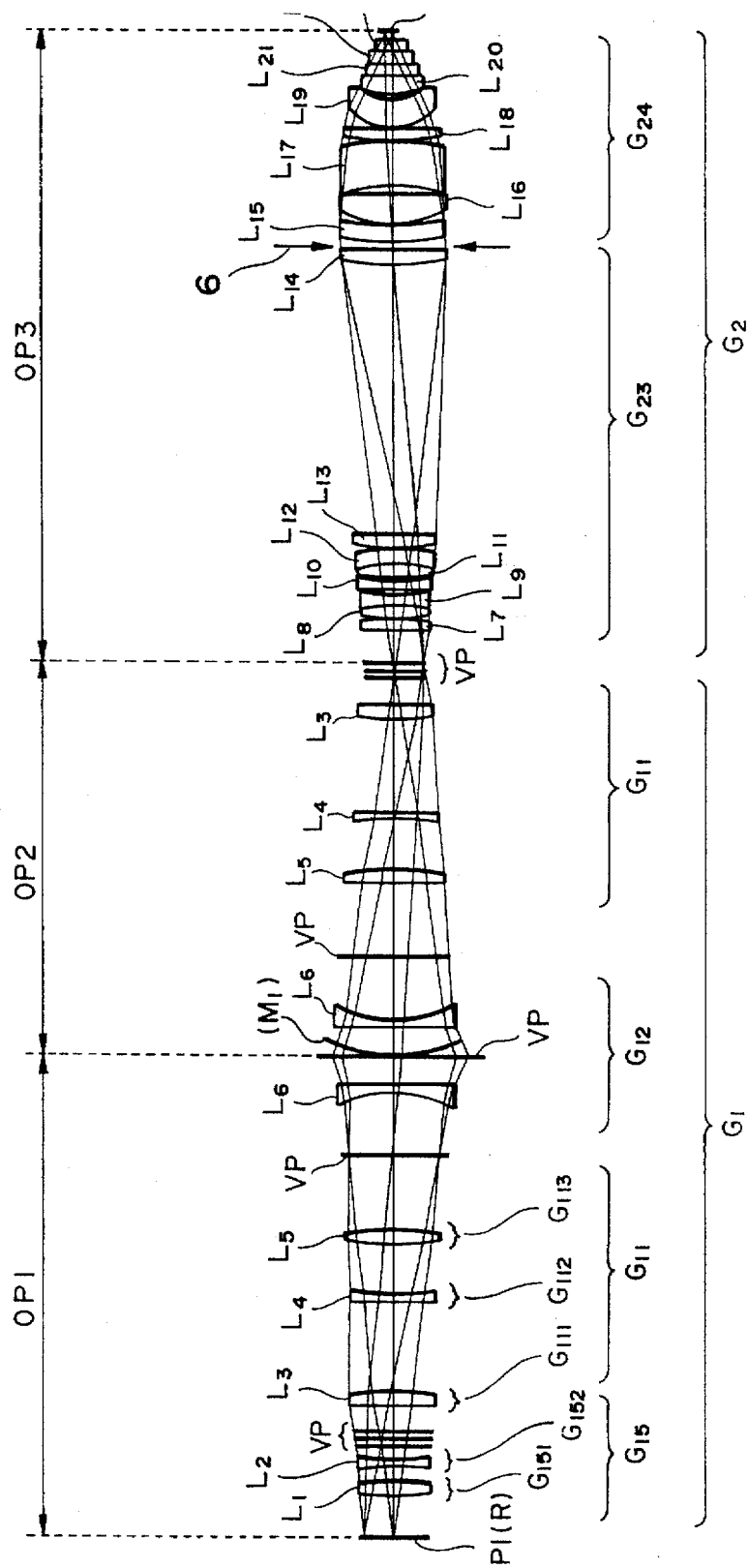
FIG. 12 is a diagram showing a developed optical path of a first lens configuration in the catadioptric optical system in accordance with the present invention.
Figure 16:
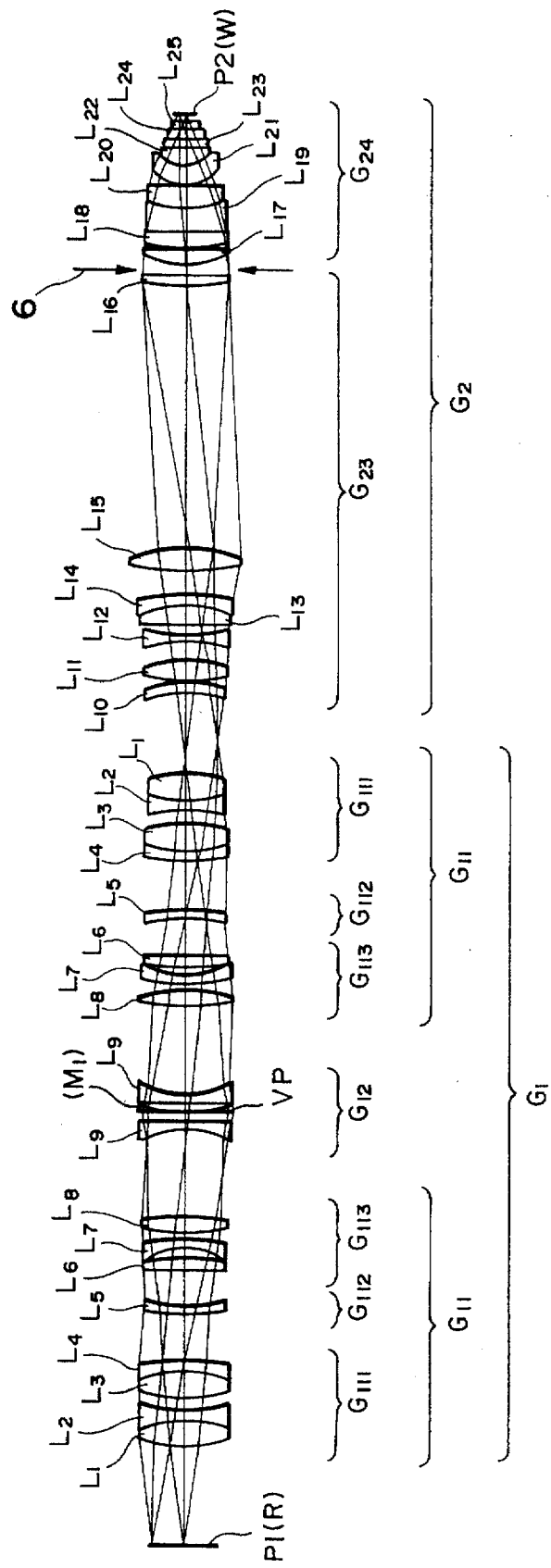
FIG. 16 is a diagram showing a developed optical path of a second lens configuration in the catadioptric optical system in accordance with the present invention.

In the following, numerical examples of the catadioptric optical system in accordance with the present invention will be explained. In the following numerical examples, first and second lens configurations are represented by developed optical path diagrams as shown in FIGS. 12 and 16. In the developed optical path diagrams, each reflective surface is represented as a transmissive surface, while optical elements are arranged in the order by which the light from the reticle R is transmitted therethrough. Also, at the reflective surface of the concave mirror, a virtual surface of a plane is used. Then, in order to represent the forms and distances of lenses, for example, as shown in FIG. 12, the pattern surface P1 (object plane) of the reticle R is defined as zero surface, while the surfaces through which the light emitted from the reticle R passes before reaching the image plane (corresponding to the surface P2) on the wafer W are successively defined as i-th surface (i=1, 2, . . . ). Here, the sign of radius of curvature $r_i$ is set plus when its convex surface is directed toward the reticle R in the developed optical path diagram. The spacing between the i-th surface and the (i+1)-th surface is defined as $d_i$. As a glass material, $SiO_2$ represents fused quartz, whereas $CaF_2$ represents fluorite. The refractive indices of fused quartz and fluorite at their standard wavelength (193.0 nm) for use are as follows:

fused quartz: 1.56019 fluorite: 1.50138

Also, their dispersion values 1/ν are as follows:

fused quartz: 1,780 fluorite: 2,550

Here, the dispersion values in the examples are those obtained at the standard wavelength (193.0 nm) for use ±0.1 nm.

(First Lens Configuration)

The first lens configuration in accordance with the present invention will be explained with reference to FIG. 12. FIG. 12 is a developed optical path diagram of the catadioptric optical system in the first lens configuration.

In the first lens configuration of lens groups shown in FIG. 12, the fifth lens group $G_{15}$ is constituted, in the following order from the side of the reticle R, by a biconvex positive lens $L_1$ which is the front lens group $G_{151}$ and a biconcave negative $L_2$ which is the rear lens group $G_{152}$. The first lens group $G_{11}$ subsequent to the fifth lens group $G_{15}$ is constituted by a biconvex positive lens $L_3$ which is the front lens group $G_{111}$; a meniscus negative lens $L_4$, which is the intermediate lens group $G_{112}$, whose convex surface faces the reticle R; and a biconvex positive lens $L_5$ which is the rear lens group $G_{113}$. Further, the second lens group $G_{12}$ subsequent to the first lens group $G_{11}$ is constituted by a meniscus negative lens $L_6$, whose concave surface faces the reticle R, and the concave mirror $M_1$.

Here, the luminous flux from the reticle R successively passes through the front lens group $G_{151}$ and rear lens group $G_{152}$ in the fifth lens group $G_{15}$; the front lens group $G_{111}$, intermediate lens group $G_{112}$, and rear lens group $G_{113}$ in the first lens group $G_{11}$; the second lens group $G_{12}$; and then the rear lens group $G_{113}$, intermediate lens group $G_{112}$, and front lens group $G_{111}$ in the first lens group $G_{11}$ again so as to form an intermediate image of the reticle R between the first lens group $G_{11}$ and the fifth lens group $G_{15}$.

The third lens group $G_{23}$ is constituted, in the following order from the side of this intermediate image, by a biconvex positive lens $L_7$ having a weak refracting power, a biconvex positive lens $L_8$, a biconcave negative lens $L_9$, a meniscus negative lens $L_{10}$ whose convex surface faces the intermediate image, a biconcave negative lens $L_{11}$, a meniscus negative lens $L_{12}$ whose concave surface faces the intermediate image, a biconvex positive lens $L_{13}$, and a biconvex positive lens $L_{14}$.

The fourth lens group $G_{24}$ subsequent to the third lens group $G_{23}$ is constituted, in the following order from the intermediate image side, by a meniscus positive lens $L_{15}$ whose convex surface faces the intermediate image, a meniscus positive lens $L_{16}$ whose convex surface faces the intermediate image, a meniscus negative lens $L_{17}$ whose concave surface faces the intermediate image, a biconvex positive lens $L_{18}$, a meniscus negative lens $L_{19}$ whose convex surface faces the intermediate image, a meniscus positive lens $L_{20}$ whose convex surface faces the intermediate image, a biconcave negative lens $L_{21}$ having a weak refracting power, a meniscus negative lens $L_{22}$ whose convex surface faces the intermediate image, and a meniscus positive lens $L_{23}$ whose convex surface faces the intermediate image.

In the following Table 1, values of various items in the lens configuration shown in FIG. 12 are listed. In this lens configuration, the magnification of the whole system is ¼ (reduction), whereas the numerical aperture NA on the side of the wafer W is 0.57. Also, as shown in FIG. 3, the exposure field on the reticle R in the catadioptric optical system in this lens configuration has a rectangular shape in which the longitudinal direction has a length of 24 defined by an object height from the optical axis AX within the range from 52 to 76 and the transverse direction has a length of 120.

In Table 1, the optical path bending mirror $M_2$ is positioned at the seventh and twenty-eighth surfaces. Also, in this table, the concave mirror $M_1$ corresponds to the eighteenth surface. In this numerical example, the seventeenth surface (virtual plane) and the eighteenth surface are made as reflective surfaces (refractive index=−1), thereby making it possible to form the developed optical path diagram shown in FIG. 12. In FIG. 12, OP1, OP2, and OP3 respectively indicate the optical path from the first surface P1 to the reflective surface of the concave mirror $M_1$, the optical path from the reflective surface of the concave mirror $M_1$ to the reflective surface of the mirror $M_2$, and the optical path from the reflective surface of the mirror $M_2$ to the second surface P2. Also, virtual planes are indicated by VP in the drawing.

TABLE 1

| | $d_0 = 100.000$ | |
|---|---|---|
| r | d | Glass Material (n) |
| 1   608.570 | 40.000 | $CaF_2$ |
| 2  −535.784 | 35.737 | |

TABLE 1-continued $d_0 = 100.000$

| | r | d | Glass Material (n) |
|---|---|---|---|
| 3 | −767.542 | 15.000 | $SiO_2$ |
| 4 | 583.270 | 35.000 | |
| 5 | 0.000 | 20.000 | Virtual Plane |
| 6 | 0.000 | 15.000 | Virtual Plane |
| 7 | 0.000 | 67.394 | Virtual Plane |
| 8 | 1932.142 | 40.000 | $CaF_2$ |
| 9 | −501.972 | 223.395 | |
| 10 | 2599.069 | 15.000 | $SiO_2$ |
| 11 | 491.076 | 123.036 | |
| 12 | 883.255 | 30.000 | $SiO_2$ |
| 13 | −2160.911 | 187.657 | |
| 14 | 0.000 | 160.860 | Virtual Plane |
| 15 | −281.482 | 15.000 | $SiO_2$ |
| 16 | −3684.750 | 70.000 | |
| 17 | 0.000 | 0.000 | Virtual Plane |
| 18 | 441.367 | 70.000 | Corresponding to Concave Mirror |
| 19 | 3684.750 | 15.000 | $SiO_2$ |
| 20 | 281.483 | 160.860 | |
| 21 | 0.000 | 187.657 | Virtual Plane |
| 22 | 2160.911 | 30.000 | $SiO_2$ |
| 23 | −883.255 | 123.036 | |
| 24 | −491.076 | 15.000 | $SiO_2$ |
| 25 | −2599.068 | 223.395 | |
| 26 | 501.972 | 40.000 | $CaF_2$ |
| 27 | −1932.142 | 67.394 | |
| 28 | 0.000 | 15.000 | Virtual Plane |
| 29 | 0.000 | 20.000 | Virtual Plane |
| 30 | 0.000 | 80.000 | Virtual Plane |
| 31 | 3884.731 | 30.000 | $SiO_2$ |
| 32 | −1381.698 | 0.100 | |
| 33 | 391.241 | 30.000 | $CaF_2$ |
| 34 | −352.648 | 5.000 | |
| 35 | −340.120 | 24.000 | $SiO_2$ |
| 36 | 348.160 | 11.200 | |
| 37 | 6861.792 | 24.000 | $SiO_2$ |
| 38 | 490.913 | 10.907 | |
| 39 | 865.932 | 30.000 | $CaF_2$ |
| 40 | −440.248 | 3.766 | |
| 41 | −326.951 | 35.000 | $SiO_2$ |
| 42 | −669.448 | 0.100 | |
| 43 | 490.606 | 35.000 | $CaF_2$ |
| 44 | −3123.854 | 672.921 | |
| 45 | 681.761 | 40.000 | $SiO_2$ |
| 46 | −8251.041 | 8.000 | |
| 47 | 0.000 | 8.000 | Aperture Stop 6 |
| 48 | 596.576 | 45.000 | $SiO_2$ |
| 49 | 664.912 | 1.260 | |
| 50 | 276.060 | 72.842 | $CaF_2$ |
| 51 | 12512.845 | 18.900 | |
| 52 | −523.686 | 106.927 | $SiO_2$ |
| 53 | −728.219 | 0.513 | |
| 54 | 704.707 | 33.464 | $CaF_2$ |
| 55 | −2768.356 | 0.367 | |
| 56 | 154.151 | 69.820 | $SiO_2$ |
| 57 | 131.256 | 12.825 | |
| 58 | 148.970 | 44.938 | $SiO_2$ |
| 59 | 1416.567 | 4.200 | |
| 60 | −1306.088 | 22.680 | $SiO_2$ |
| 61 | 6140.209 | 1.920 | |
| 62 | 1077.774 | 30.410 | $SiO_2$ |
| 63 | 604.397 | 2.252 | |
| 64 | 326.875 | 29.808 | $SiO_2$ |
| 65 | 5403.630 | 15.000 | |

Figure 13:
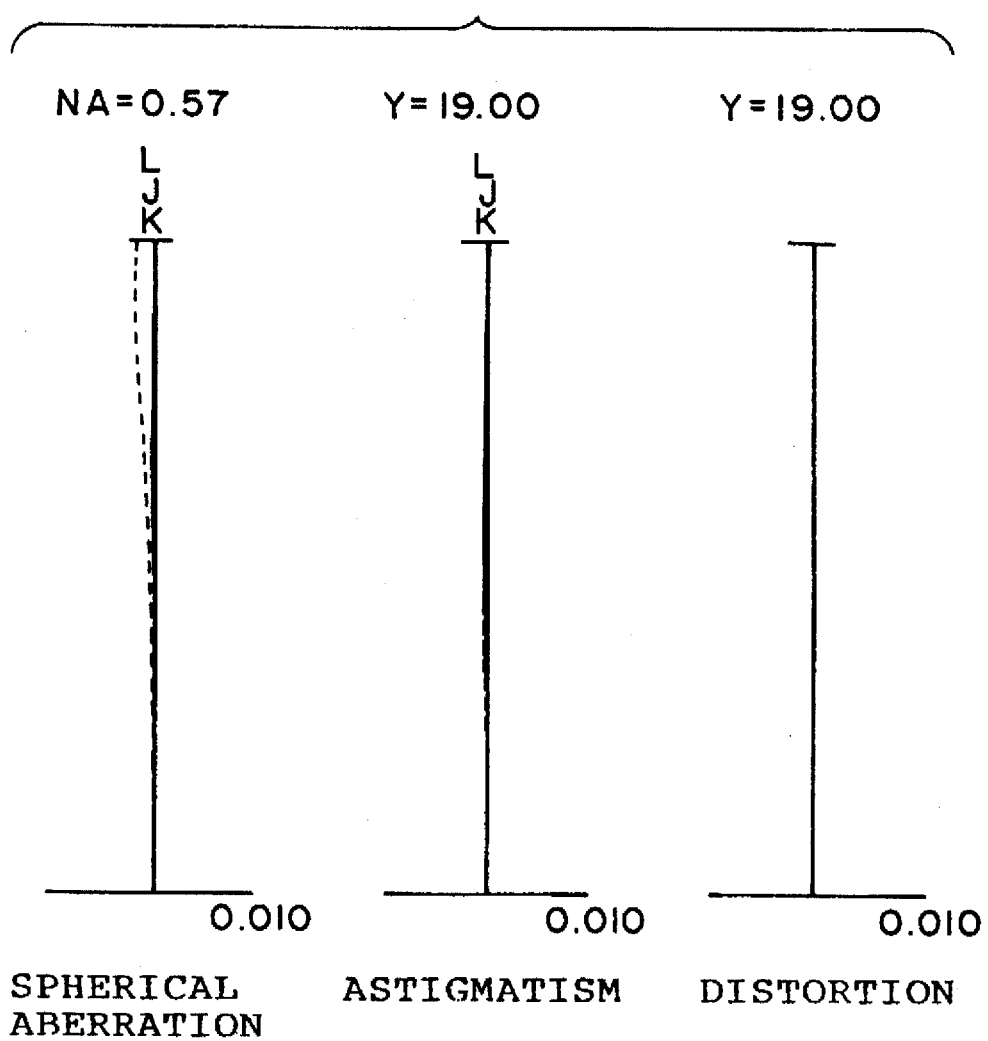
FIGS. 13 to 15 are charts showing various aberrations of the catadioptric optical system shown in FIG. 12.
Figure 14:
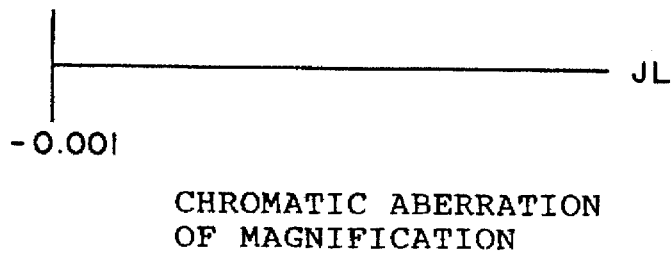
Figure 15:
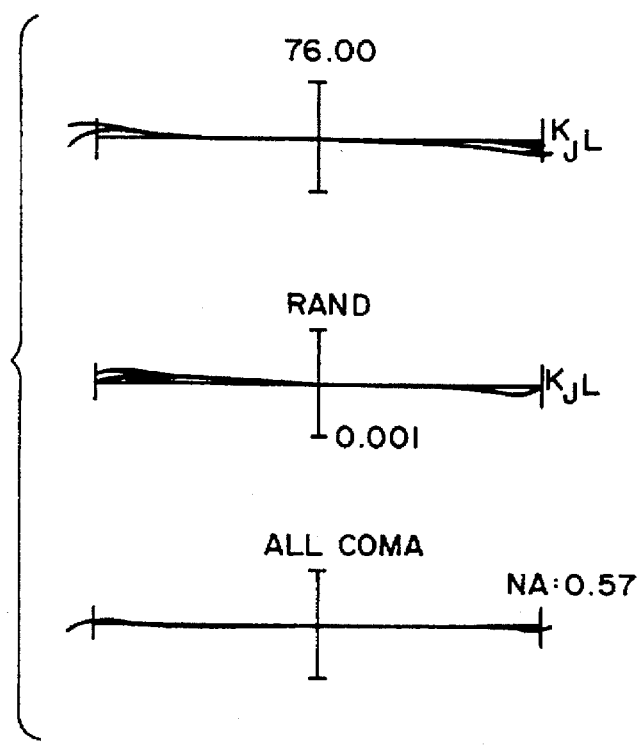

The condition correspondence values are as follows:

(1) $|Y0/Y1|=0.97$
(2) $|\beta|=0.25$
(3) $P4=-0.00689$
(4) $P3+P5+P6+P=0.00608$
(5) $|P3+P4+P5+P6+P7|=-0.00081$
(6) $|P1+P2|=0.00000$ FIG. 13 is a chart showing the longitudinal aberration in the first lens configuration (FIG. 12). FIG. 14 is a chart showing the chromatic aberration of magnification in the first lens configuration. FIG. 15 is a chart showing the transverse aberration in the first lens configuration. In each aberration chart, NA indicates the numerical aperture, whereas Y indicates the image height. Also, marks J, K, and L respectively indicate wavelengths at 193.0 nm, 192.9 nm, and 193.1 nm. In FIG. 13, broken curve in the chart showing the spherical aberration indicates a sine condition infringing amount, whereas broken curve and continuous curve in the chart showing the astigmatism respectively indicate meridional and sagittal image surfaces. In the transverse aberration chart shown in FIG. 15, the number written at the upper portion of each coma chart indicates the object height and, in particular, RAND indicates that the object height is zero.

From the various aberration charts shown in FIGS. 13 to 15, it can be seen that, in this numerical example, while the numerical aperture is as large as 0.57, various aberrations are favorably corrected in a wide range. Also, from the various aberration charts shown in FIGS. 13 to 15, it can be seen that, in this numerical example, the axial aberration and the chromatic aberration of magnification are favorably corrected within the range of wavelength width of 0.1 nm.

(Second Lens Configuration)

The second lens configuration in accordance with the present invention will be explained with reference to FIG. 16. FIG. 16 is a developed optical path diagram of the catadioptric optical system in the second lens configuration.

The lens configuration (second lens configuration) of lens groups shown in FIG. 16 is constituted, in the following order from the side of the reticle R, by the front lens group $G_{111}$, intermediate lens group $G_{112}$, and rear lens group $G_{113}$ in the first lens group $G_{11}$. Here, the front lens group $G_{111}$ is constituted by a biconvex positive lens $L_1$, a biconcave negative lens $L_2$, a biconvex positive lens $L_3$, and a meniscus negative lens $L_4$ whose concave surface faces the reticle R. The intermediate lens group $G_{112}$ is a meniscus negative lens $L_5$ whose convex surface faces the reticle R. The rear lens group $G_{113}$ is constituted by a biconvex positive lens $L_6$, a meniscus negative lens $L_7$ whose convex surface faces the reticle R, and a biconvex positive lens $L_8$. Further, the second lens group $G_{12}$ subsequent to the first lens group $G_{11}$ is constituted by a negative lens $L_9$, whose concave surface faces the reticle R, and the concave mirror $M_1$.

Here, the luminous flux from the reticle R successively passes through the front lens group $G_{111}$, intermediate lens group $G_{112}$, and rear lens group $G_{113}$ in the first lens group $G_{11}$; the second lens group $G_{12}$; and then the rear lens group $G_{113}$, intermediate lens group $G_{112}$, and front lens group $G_{111}$ in the first lens group $G_{11}$ again so as to form an intermediate image of the reticle R between the first lens group $G_{11}$ and the reticle R.

The third lens group $G_{23}$ is constituted, in the following order from the side of this intermediate image, by a meniscus negative lens $L_{10}$ whose concave surface faces the intermediate image, a biconvex positive lens $L_{11}$, a biconcave negative lens $L_{12}$, a biconvex positive lens $L_{13}$, and a meniscus negative lens $L_{14}$ whose concave surface faces the intermediate image, a biconvex positive lens $L_{15}$, and a biconvex positive lens $L_{16}$.

The fourth lens group $G_{24}$ subsequent to the third lens group $G_{23}$ is constituted, in the following order from the side of the intermediate image, by a meniscus positive lens $L_{17}$ whose convex surface faces the intermediate image, a biconvex positive lens $L_{18}$, a biconcave negative lens $L_{19}$, a meniscus positive lens $L_{20}$ whose convex surface faces the intermediate image, a meniscus negative lens $L_{21}$ whose convex surface faces the intermediate image, a meniscus positive lens $L_{22}$ whose convex surface faces the intermediate image, a meniscus negative lens $L_{23}$ whose concave surface faces the intermediate image, a biconvex positive lens $L_{24}$, and a meniscus positive lens $L_{25}$ whose convex surface faces the intermediate image. Here, the aperture stop 6 is disposed between the third lens group $G_{23}$ and the fourth lens group $G_{24}$.

In the following Table 2, values of various items in this lens configuration are listed. In this lens configuration, the magnification of the whole system is ¼ (reduction), whereas the numerical aperture NA on the side of the wafer W is 0.57. In this lens configuration, the exposure field on the reticle R in the catadioptric optical system has a rectangular shape in which the longitudinal direction has a length of 24 defined by an object height from the optical axis AX within the range from 48 to 72 and the transverse direction has a length of 120.

In Table 2, the concave mirror $M_1$ corresponds to the twentieth surface. In this numerical example, the nineteenth surface (virtual plane) and the twentieth surface are made as reflective surfaces (refractive index=−1), thereby making it possible to form the developed optical path diagram shown in FIG. 16. Also, a virtual plane is indicated by VP in the drawing.

TABLE 2

$d_0 = 218.470$

|    | r          | d       | n                |
|----|------------|---------|------------------|
| 1  | 269.428    | 60.000  | CaF$_2$          |
| 2  | −309.838   | 5.000   |                  |
| 3  | −287.784   | 15.000  | SiO$_2$          |
| 4  | 298.252    | 31.810  |                  |
| 5  | 319.859    | 60.000  | CaF$_2$          |
| 6  | −267.967   | 4.500   |                  |
| 7  | −273.316   | 20.000  | SiO$_2$          |
| 8  | −714.458   | 113.482 |                  |
| 9  | 1247.366   | 16.200  | SiO$_2$          |
| 10 | 358.307    | 83.901  |                  |
| 11 | 1886.366   | 25.920  | CaF$_2$          |
| 12 | −409.348   | 19.000  |                  |
| 13 | −191.202   | 20.000  | SiO$_2$          |
| 14 | −460.687   | 15.474  |                  |
| 15 | 402.149    | 33.000  | SiO$_2$          |
| 16 | −903.948   | 201.807 |                  |
| 17 | −197.350   | 15.000  | SiO$_2$          |
| 18 | 231563.902 | 20.000  |                  |
| 19 | 0.000      | 0.000   | Virtual Plane    |
| 20 | 314.319    | 20.000  | Corresponding to Concave Mirror |
| 21 | 231563.902 | 15.000  | SiO$_2$          |
| 22 | 197.350    | 201.807 |                  |
| 23 | 903.948    | 33.000  | SiO$_2$          |
| 24 | −402.149   | 15.474  |                  |
| 25 | 460.687    | 20.000  | SiO$_2$          |
| 26 | 191.202    | 19.000  |                  |
| 27 | 409.348    | 25.920  | CaF$_2$          |
| 28 | 1886.369   | 83.901  |                  |
| 29 | −358.307   | 16.200  | SiO$_2$          |
| 30 | −1247.366  | 113.482 |                  |
| 31 | 714.458    | 20.000  | SiO$_2$          |
| 32 | 273.316    | 4.500   |                  |
| 33 | 267.967    | 60.000  | CaF$_2$          |
| 34 | −319.859   | 31.810  |                  |
| 35 | −298.252   | 15.000  | SiO$_2$          |
| 36 | 287.784    | 5.000   |                  |
| 37 | 309.838    | 60.000  | CaF$_2$          |
| 38 | −269.428   | 183.470 |                  |
| 39 | −227.267   | 20.000  | CaF$_2$          |
| 40 | −391.496   | 3.645   |                  |
| 41 | 617.033    | 45.000  | SiO$_2$          |

TABLE 2-continued $d_0 = 218.470$

|    | r         | d       | n              |
|----|-----------|---------|----------------|
| 42 | −292.147  | 46.222  |                |
| 43 | −259.118  | 15.000  | SiO$_2$        |
| 44 | 408.199   | 18.785  |                |
| 45 | 1461.463  | 45.000  | CaF$_2$        |
| 46 | −250.187  | 7.000   |                |
| 47 | −223.680  | 18.000  | SiO$_2$        |
| 48 | −526.047  | 56.717  |                |
| 49 | 936.544   | 45.000  | CaF$_2$        |
| 50 | 406.507   | 590.310 |                |
| 51 | 795.462   | 29.000  | SiO$_2$        |
| 52 | −1984.285 | 10.000  |                |
| 53 | 0.000     | 10.000  | Aperture Stop 6 |
| 54 | 230.009   | 32.805  | SiO$_2$        |
| 55 | 1447.955  | 5.000   |                |
| 56 | 613.320   | 35.000  | CaF$_2$        |
| 57 | −1494.241 | 7.137   |                |
| 58 | −694.448  | 40.000  | SiO$_2$        |
| 59 | 478.128   | 5.000   |                |
| 60 | 372.847   | 48.067  | CaF$_2$        |
| 61 | 2287.239  | 0.100   |                |
| 62 | 100.159   | 42.562  | SiO$_2$        |
| 63 | 80.943    | 9.000   |                |
| 64 | 86.320    | 28.964  | SiO$_2$        |
| 65 | 1884.561  | 4.000   |                |
| 66 | −401.131  | 17.580  | SiO$_2$        |
| 67 | −2761.121 | 0.100   |                |
| 68 | 508.419   | 21.383  | SiO$_2$        |
| 69 | −577.558  | 0.100   |                |
| 70 | 647.419   | 15.000  | SiO$_2$        |
| 71 | 3939.247  | 15.000  |                |

Figure 17:
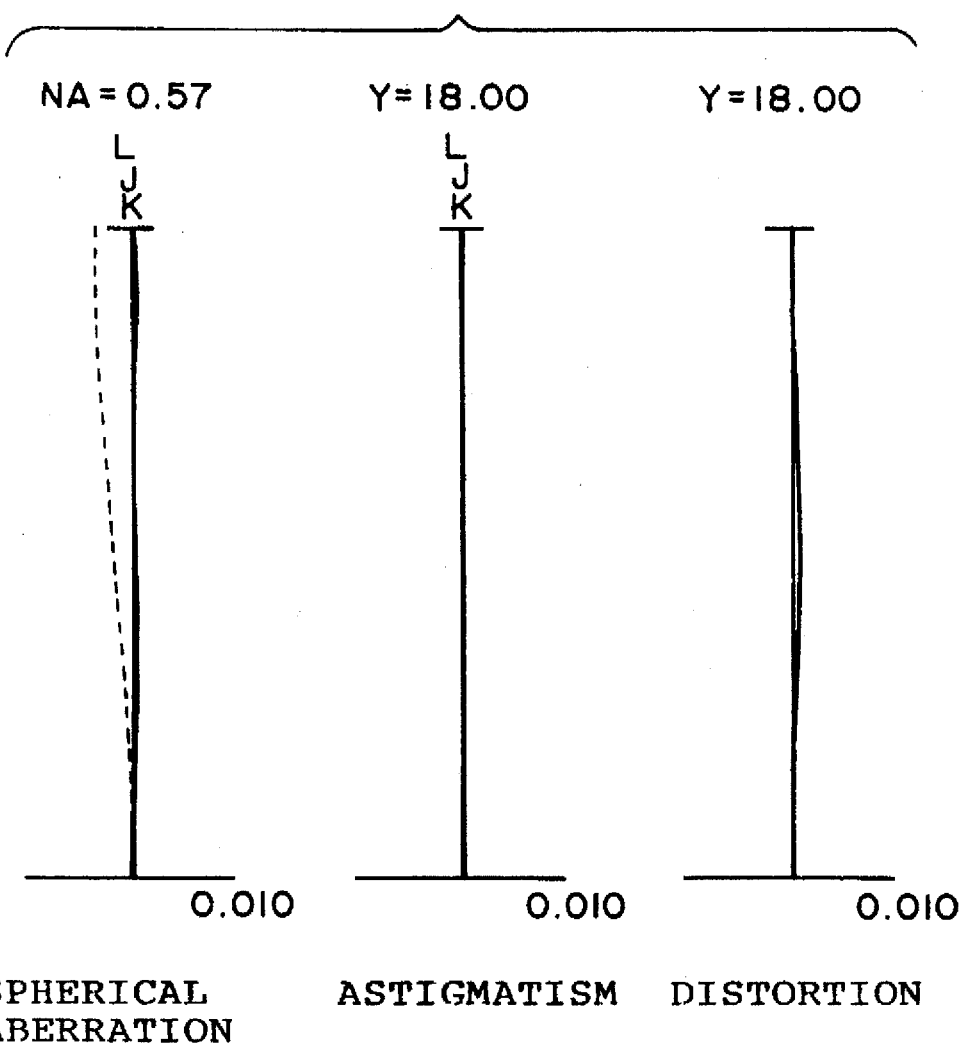
FIGS. 17 to 19 are charts showing various aberrations of the catadioptric optical system shown in FIG. 16.
Figure 18:
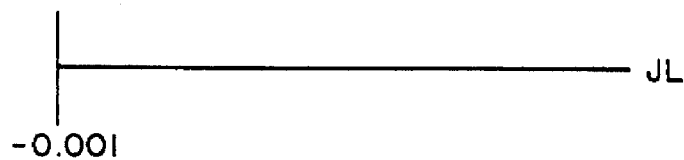
Figure 19:
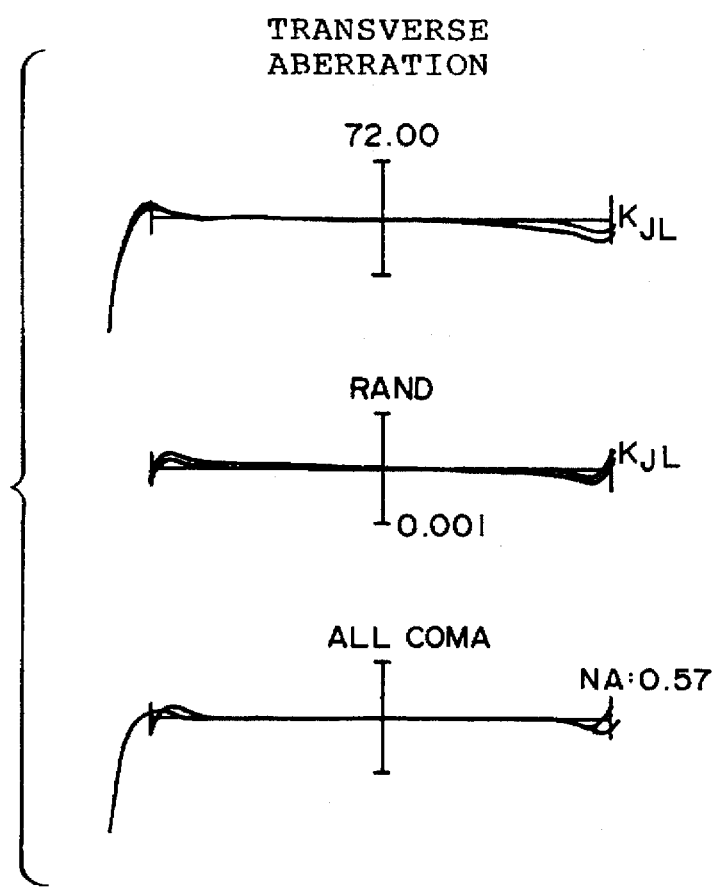

The condition correspondence values are as follows:

(1) $|Y0/Y1|=0.97$ (2) $|\beta|=0.25$ (3) $P4=-0.01$ (4) $P3+P5+P6+P7=0.00855$ (5) $|P3+P4+P5+P6+P7|=-0.00145$ (6) $|P1+P2|=0.00001$ FIG. 17 is a chart showing the longitudinal aberration in the second lens configuration (FIG. 16). FIG. 18 is a chart showing the chromatic aberration of magnification in the second lens configuration. FIG. 19 is a chart showing the transverse aberration in the second lens configuration. In each aberration chart, NA indicates the numerical aperture, whereas Y indicates the image height. Also, marks J, K, and L respectively indicate wavelengths at 193.0 nm, 192.9 nm, and 193.1 nm. In FIG. 17, broken curve in the chart showing the spherical aberration indicates a sine condition infringing amount, whereas broken curve and continuous curve in the chart showing the astigmatism respectively indicate meridional and sagittal image surfaces. In the transverse aberration chart shown in FIG. 19, the number written at the upper portion of each coma chart indicates the object height and, in particular, RAND indicates that the object height is zero.

From the various aberration charts shown in FIGS. 17 to 19, it can be seen that, in this numerical example, while the numerical aperture is as large as 0.57, various aberrations are favorably corrected in a wide range. Also, from the various aberration charts shown in FIGS. 17 to 19, it can be seen that, in this numerical example, the axial aberration and the chromatic aberration of magnification are favorably corrected within the range of wavelength width of 0.1

As explained in the foregoing, in the numerical examples in accordance with the present invention, there can be provided a catadioptric optical system in which, while attaining a very large numerical aperture, the concave mirror $M_1$ is small and various aberrations are favorably corrected in a wide exposure area. In the first lens configuration, the concave mirror $M_1$ can have a diameter of about 330. In the second lens configuration, the concave mirror $M_1$ can have a diameter of about 210. Also, in each of these lens configurations, the diameters of refractive lenses can be reduced.

Also, in the foregoing embodiments, the optical path bending mirror $M_2$, which is used as the optical path deflecting means, is disposed near the intermediate image formed by the first imaging optical system $G_1$, the influence of eccentric errors of the first and second imaging optical systems $G_1$ and $G_2$ upon the optical path bending mirror $M_2$ can be reduced. Further, in the foregoing embodiments, since the diameter of the luminous flux reaching the reflective surface of the optical path bending mirror $M_2$ becomes smaller, the size of the optical path bending mirror $M_2$ itself can be reduced. Accordingly, the optical path bending mirror $M_2$ can be prevented from eclipsing the luminous flux, thereby advantageously expanding the exposure area.

Further, the foregoing embodiments are advantageous in that, since the luminous flux from the first imaging optical system $G_1$ is deflected by the optical path bending mirror $M_2$ by 90° and then guided to the second imaging optical system $G_2$, the eccentricities of the first imaging optical system $G_1$ and the second imaging optical system $G_2$ with respect to each other can be easily adjusted.

Also, in the foregoing embodiments, since the aperture stop 6 can be disposed between the third lens group $G_{23}$ and fourth lens group $G_{24}$ in the second imaging optical system $G_2$, when this aperture stop 6 has a variable aperture size, the exposure with variable NA (i.e., variable σ) can be attained.

Here, when a beam splitter is used in place of the optical path bending mirror $M_1$ in the foregoing embodiments, collective exposure with the object height on the reticle R from the optical axis AX within the range of 0 to 72 (to 76 being usable in the first numerical example) can be effected.

Figure 24:
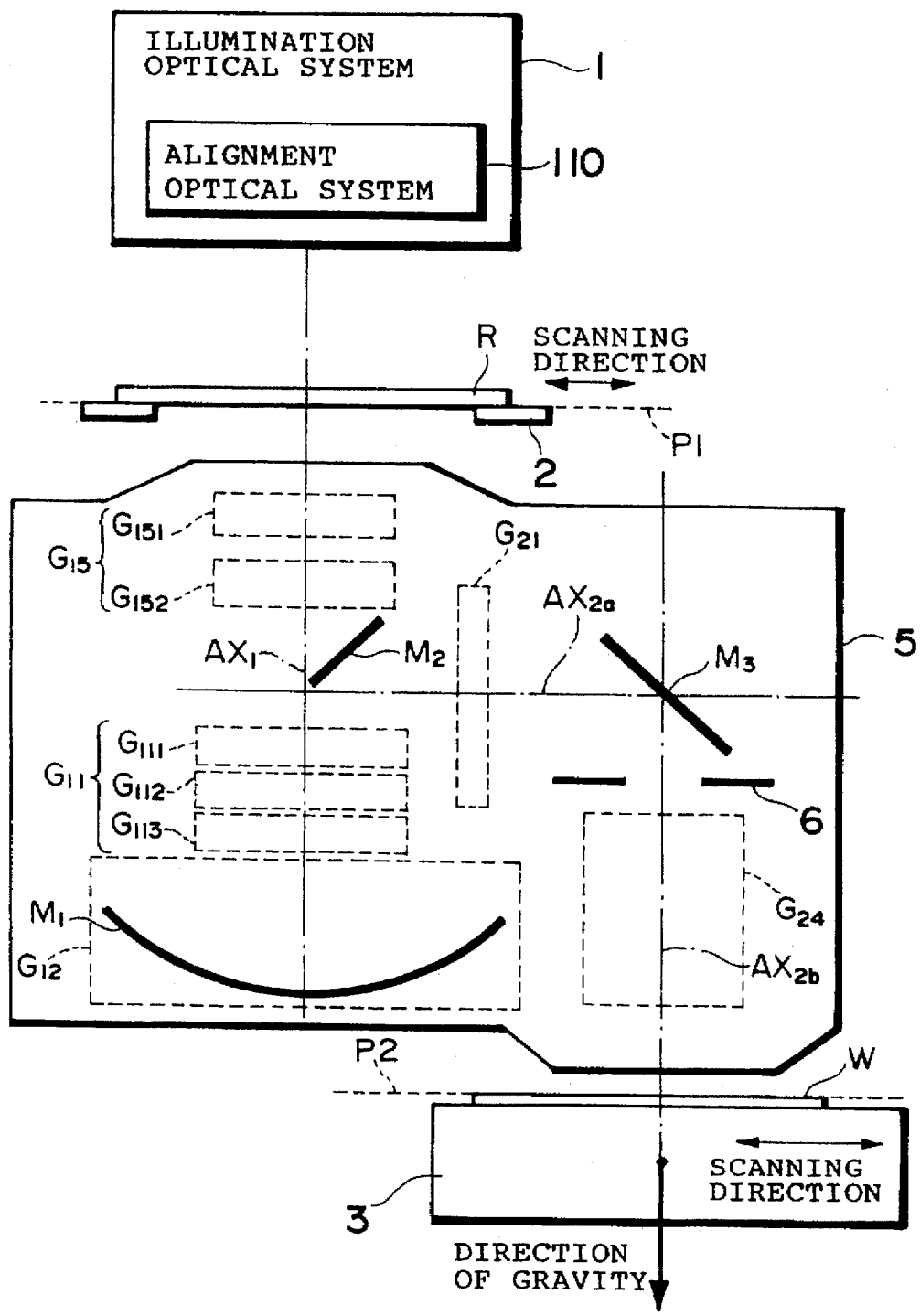
FIG. 24 is a schematic view showing a configuration of a catadioptric optical system applied to a general exposure apparatus.

FIG. 24 is a view showing a state where the optical system shown in FIG. 9, as the catadioptric optical system in accordance with the present invention, is applied to the general exposure apparatus such as that shown in FIG. 1 or 2.

In accordance with the present invention, as explained in the foregoing, the diameter of the concave mirror can be reduced and, while securing a sufficient working distance, a large numerical aperture can be realized.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 082380/1995 (7-082380) filed on Apr. 7, 1995, and 030978/1996 (8-030978) filed on Feb. 19, 1996, are hereby incorporated by reference.

What is claimed is:

1. A catadioptric optical system comprising:
    a first imaging optical system forming an intermediate image of a pattern provided on a first surface, said first imaging optical system including a first lens group with a positive refracting power and a second lens group which includes a concave mirror having a concave surface facing said first surface, said second lens group having a negative lens component;
    a second imaging optical system forming an image of said intermediate image upon a second surface, a composite magnification of said first and second imaging optical systems being a reduction magnification; and
    a first optical path deflecting member disposed in an optical path from said first imaging optical system to said second imaging optical system so as to guide light from said first imaging optical system to said second imaging optical system,
    wherein a part of the first lens group of said first imaging optical system is positioned between said first optical path deflecting member and said second lens group, in a space through which both light directed from said first surface to said second lens group and light directed from said second lens group to said first optical path deflecting member pass, and
    wherein the first lens group includes, in the following order from said first surface toward said second lens group, a front lens group having a positive refracting power, an intermediate lens group having a negative refracting power, and a rear lens group having a positive refracting power.

2. A catadioptric optical system according to claim 1, wherein said first imaging optical system has a reducing power and said second imaging optical system has a reducing power.

3. A catadioptric optical system according to claim 1, wherein said first optical path deflecting member is disposed, in an optical path between said first surface and said first lens group, at a position deviated from an optical axis of said first lens group.

4. A catadioptric optical system according to claim 1, wherein said second imaging optical system comprises a third lens group having a positive refracting power and a fourth lens group having a positive refracting power, said third lens group and fourth lens group being disposed such that light from said first imaging optical system successively passes through said third lens group and said fourth lens group so as to be guided to said second surface.

5. A catadioptric optical system according to claim 4, further comprising a first aperture stop disposed in an optical path between said third lens group and said fourth lens group.

6. A catadioptric optical system according to claim 1, further comprising a fifth lens group disposed in an optical path between said first surface and said first lens group, said fifth lens group including, in the following order from said first surface toward said first lens group, a front lens group with a positive refracting power and a rear lens group with a negative refracting power.

7. A catadioptric optical system according to claim 6, wherein said first optical path deflecting member is disposed, in an optical path between said first surface and said fifth lens group, at a position deviated from an optical axis of said fifth lens group.

8. A catadioptric optical system according to claim 1, wherein, assuming that the pattern on said first surface has a height Y0 and said intermediate image formed by said first imaging optical system has an image height Y1, said catadioptric optical system satisfies the following condition:

$$0.4 < |Y0/Y1| < 1.2.$$

9. A catadioptric optical system according to claim 1, wherein each of lens components constituting said second imaging optical system comprises one of at least two kinds of optical materials having dispersion values different from each other.

10. A catadioptric optical system according to claim 4, wherein said third lens group in said second imaging optical system includes at least a negative lens component and a positive lens component, and wherein said fourth lens group in said second imaging optical system includes at least a positive lens component.

11. A catadioptric optical system according to claim 1, further comprising a second optical path deflecting member disposed in an optical path between said first surface and said first lens group so as to deflect light from said first surface, whereby said first surface and said second surface are placed in parallel to each other.

12. A catadioptric optical system according to claim 11, wherein said first surface and said second surface are disposed such that a normal of said first surface and a normal of the second surface are orthogonal to a direction of gravity.

13. A catadioptric optical system according to claim 4, further comprising a third optical path deflecting member disposed in an optical path between said third lens group and said fourth lens group so as to deflect light from said third lens group, whereby said first surface and said second surface are placed in parallel to each other.

14. A catadioptric optical system according to claim 13, wherein said first surface and said second surface are disposed horizontally with respect to a direction of gravity, while said first surface is positioned above said second surface.

15. A catadioptric optical system according to claim 1, further comprising a field stop disposed on a surface where said intermediate image is formed in an optical path between said first imaging optical system and said second imaging optical system so as to change a size of an image-forming field on said second surface.

16. A catadioptric optical system according to claim 1, further comprising a filter for increasing a depth of focus, said filter being disposed at a position in an optical path between said rear lens group in said first lens group and said second lens group or a position in an optical path of said second imaging optical system.

17. A catadioptric optical system according to claim 16, further comprising an aperture stop disposed at a position in the optical path of said second imaging optical system or a position in the optical path between said rear lens group in said first lens group and said second lens group.

18. An exposure apparatus comprising:

a first stage capable of holding a photosensitive substrate on a main surface thereof;

a second stage for holding a mask with a predetermined an illumination optical system for irradiating said mask with exposure light having a predetermined wavelength so as to transfer an image of the predetermined pattern on said mask onto said substrate; and a catadioptric optical system provided between said first stage and said second stage so as to project the pattern on said mask onto said substrate, said catadioptric optical system comprising:

a first imaging optical system forming an intermediate image of the pattern provided on said mask, said first imaging optical system including a first lens group with a positive refracting power and a second lens group which includes a concave mirror having a concave surface facing said mask, said second lens group having a negative lens component;

a second imaging optical system forming an image of said intermediate image upon said substrate, a composite magnification of said first and second imaging optical systems being a reduction magnification; and a first optical path deflecting member disposed in an optical path from said first imaging optical system to said second imaging optical system so as to guide light from said first imaging optical system to said second imaging optical system, wherein a part of the first lens group of said first imaging optical system is positioned between said first optical path deflecting member and said second lens group, in a space through which both light directed from said mask to said second lens group and light directed from said second lens group to said first optical path deflecting member pass, and wherein the first lens group includes, in the following order from said mask toward said second lens group, a front lens group having a positive refracting power, an intermediate lens group having a negative refracting power, and a rear lens group having a positive refracting power.

19. An exposure apparatus according to claim 18, wherein said first imaging optical system has a reducing power and said second imaging optical system has a reducing power.

20. An exposure apparatus according to claim 18, wherein said second imaging optical system in said catadioptric optical system comprises a third lens group having a positive refracting power and a fourth lens group having a positive refracting power, said third lens group and fourth lens group being disposed such that light from said first imaging optical system successively passes through said third lens group and said fourth lens group so as to be guided onto said photosensitive substrate.

21. An exposure apparatus according to claim 20, wherein said catadioptric optical system further comprises a first aperture stop disposed in an optical path between said third lens group and said fourth lens group.

22. An exposure apparatus according to claim 18, wherein said catadioptric optical system further comprises a fifth lens group disposed in an optical path between said mask and said first lens group, said fifth lens group including, in the following order from said mask toward said first lens group, a front lens group with a positive refracting power and a rear lens group with a negative refracting power.

23. An exposure apparatus according to claim 18, wherein, assuming that the pattern on said mask has a height Y0 and said intermediate image formed by said first imaging optical system has an image height Y1, said catadioptric optical system satisfies the following condition:

$$0.4 < |Y0/Y1| < 1.2.$$

24. An exposure apparatus according to claim 18, wherein each of lens components constituting said second imaging optical system comprises one of at least two kinds of optical materials having dispersion values different from each other.

25. An exposure apparatus according to claim 20, wherein said third lens group in said second imaging optical system includes at least a negative lens component and a positive lens component, and wherein said fourth lens group in said second imaging optical system includes at least a positive lens component.

26. An exposure apparatus according to claim 18, wherein said catadioptric optical system further comprises a second optical path deflecting member disposed in an optical path between said mask and said first lens group so as to deflect light from said mask, whereby a reference surface of said mask and a reference surface of said photosensitive substrate are placed in parallel to each other.

27. An exposure apparatus according to claim 26, wherein said first stage and said second stage are disposed such that a normal of said mask and a normal of a surface of said substrate are orthogonal to a direction of gravity.

28. An exposure apparatus according to claim 20, wherein said catadioptric optical system further comprises a third optical path deflecting member disposed in an optical path between said third lens group and said fourth lens group so as to deflect light from said third lens group, whereby a reference surface of said mask and a reference surface of said substrate are placed in parallel to each other.

29. An exposure apparatus according to claim 28, wherein said first stage and said second stage are disposed such that said mask and a surface of said photosensitive substrate are disposed horizontally to a direction of gravity, while said mask is positioned above said substrate.

30. An exposure apparatus according to claim 18, wherein said catadioptric optical system further comprises a field stop disposed on a surface where said intermediate image is formed in an optical path between said first imaging optical system and said second imaging optical system so as to change a size of an image-forming field on said substrate.

31. An exposure apparatus according to claim 18, wherein said catadioptric optical system further comprises a filter for increasing a depth of focus, said filter being disposed at a position in an optical path between said rear lens group in said first lens group and said second lens group or a position in an optical path of said second imaging optical system.

32. An exposure apparatus according to claim 31, wherein said catadioptric optical system further comprises an aperture stop disposed at a position in the optical path of said second imaging optical system or a position in the optical path between said rear lens group in said first lens group and said second lens group.

* * * * *